(12) United States Patent
Park et al.

(10) Patent No.: US 8,569,182 B2
(45) Date of Patent: Oct. 29, 2013

(54) METHODS OF FABRICATING THREE-DIMENSIONAL SEMICONDUCTOR DEVICE

(75) Inventors: Sang-Yong Park, Suwon-si (KR); Eunsun Youm, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/342,322

(22) Filed: Jan. 3, 2012

(65) Prior Publication Data
US 2012/0171861 A1    Jul. 5, 2012

(30) Foreign Application Priority Data
Jan. 3, 2011    (KR) .................. 10-2011-0000276

(51) Int. Cl.
*H01L 21/461*    (2006.01)

(52) U.S. Cl.
USPC ............ 438/738; 257/E21.219; 257/E21.221; 257/E21.223; 438/257; 438/261; 438/288; 438/595; 438/689; 438/735; 438/739

(58) Field of Classification Search
USPC .................. 257/E21.219, E21.221, E21.223; 438/257, 261, 288, 595, 689, 735, 738, 438/739
See application file for complete search history.

(56) References Cited

U.S. PATENT DOCUMENTS

| | | | | |
|---|---|---|---|---|
| 6,153,457 A | * | 11/2000 | Kuo | 438/233 |
| 7,910,432 B2 | | 3/2011 | Tanaka et al. | |
| 2010/0013049 A1 | | 1/2010 | Tanaka et al. | |

FOREIGN PATENT DOCUMENTS

| | | |
|---|---|---|
| JP | 2009-170661 | 7/2009 |
| JP | 2009-224265 | 10/2009 |
| JP | 2009-224612 | 10/2009 |
| JP | 2010-027870 | 2/2010 |

\* cited by examiner

*Primary Examiner* — Asok K Sarkar
(74) *Attorney, Agent, or Firm* — Lee & Morse, P.C.

(57) ABSTRACT

A method of fabricating a three-dimensional semiconductor device includes forming a stacked structure, and the stacked structure includes a first layer, a second layer, a third layer, and a fourth layer sequentially stacked on a substrate. The method also includes forming a sacrificial spacer on a sidewall of the stacked structure such that the sacrificial spacer exposes a sidewall of the third layer, and recessing the exposed sidewall of the third layer thereby forming a recess region between the second and fourth layers.

20 Claims, 30 Drawing Sheets

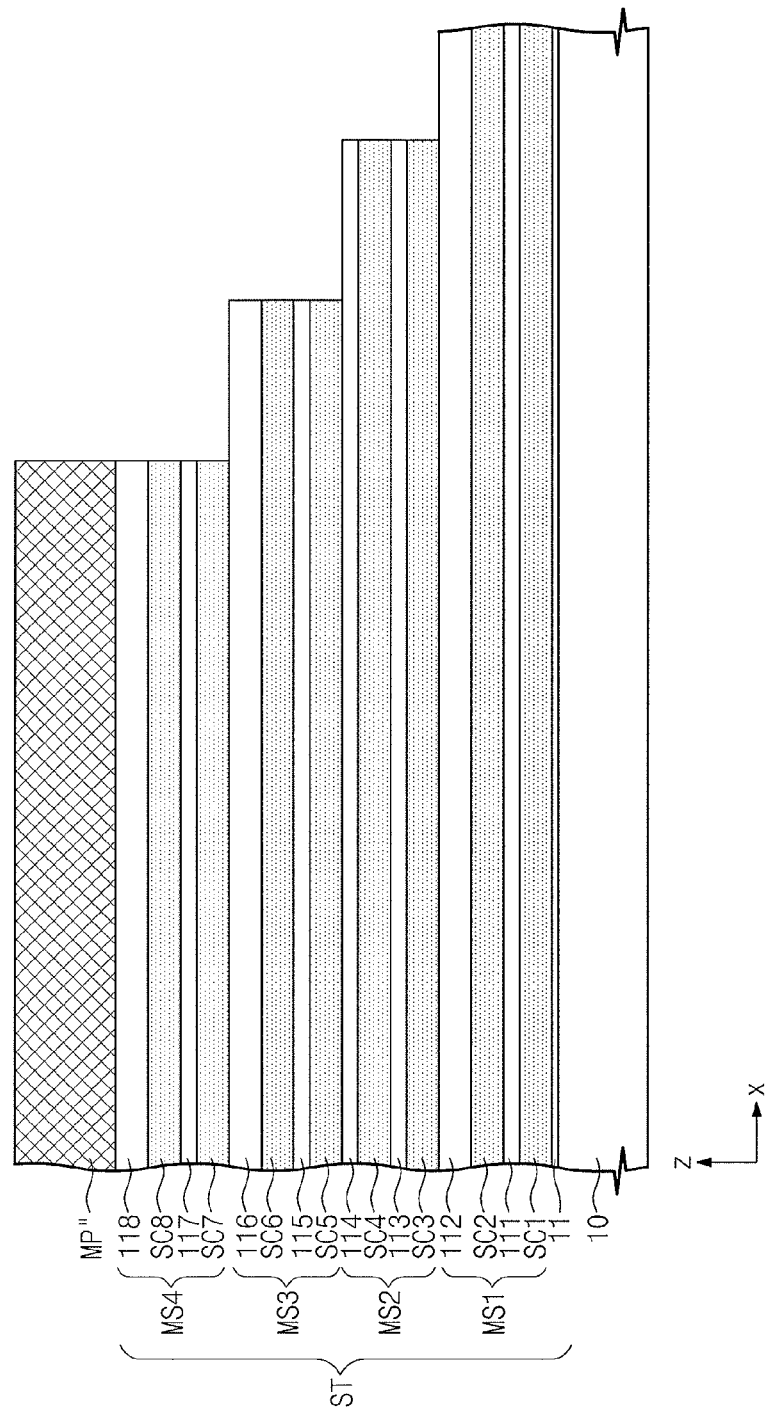

METHODS OF FABRICATING THREE-DIMENSIONAL SEMICONDUCTOR DEVICE

CROSS-REFERENCE TO RELATED APPLICATION

Korean Patent Application No. 10-2011-0000276, filed on Jan. 3, 2011, in the Korean Intellectual Property Office, and entitled: "Methods of Fabricating Three-Dimensional Semiconductor Device," is incorporated by reference herein in its entirety.

BACKGROUND

Higher integration of semiconductor devices is desired for, e.g., superior performance and/or reducing the price of electronic devices. In the case of semiconductor memory devices, integration may be an important factor in determining product price. The integration level of typical two-dimensional or planar semiconductor memory devices may be determined, e.g., by the area occupied by a unit memory cell. Accordingly, in such devices, integration may be influenced by the level of fine pattern forming technology used in a manufacturing process. However, the processing equipment needed to increase the fineness of patterns may be expensive and may set a practical limitation on increasing integration for two-dimensional or planar semiconductor devices. Accordingly, three-dimensional semiconductor memory devices having three-dimensionally arranged memory cells have been proposed.

SUMMARY

Embodiments may be realized by providing a method of fabricating a three-dimensional semiconductor device that includes forming a stacked structure, the stacked structure including a first layer, a second layer, a third layer, and a fourth layer sequentially stacked on a substrate, forming a sacrificial spacer on a sidewall of the stacked structure such that the sacrificial spacer exposes a sidewall of the third layer, and recessing the exposed sidewall of the third layer thereby forming a recess region between the second and fourth layers.

The first layer may be formed of substantially a same first material as the third layer, the second layer may be formed of substantially a same second material as the fourth layer, and the first material of the first and third layers may have an etching selectivity with respect to the second material of the second and fourth layers.

Forming the sacrificial spacer may include forming a sacrificial spacer layer to conformally cover the stacked structure, and the sacrificial spacer layer may be formed of a material having an etching selectivity with respect to the third layer during the recessing of the exposed sidewall of the third layer. Forming the sacrificial spacer may include anisotropically etching the sacrificial spacer layer to form the sacrificial spacer. A sidewall of the first layer may be covered by the sacrificial spacer during the forming of the recess region.

The method may include, after forming the recess region, etching the second and fourth layers to expose end portions of the first and third layers at locations different from each other. Forming the stacked structure may include stacking a plurality of multi-layered structures on the substrate, and each of the multi-layered structures may include the first, the second, the third and the fourth layers sequentially stacked therein. Forming the stacked structure may include patterning the multi-layered structures to expose end portions of the multi layered structures at locations different from each other to form patterned multi layered structures.

Widths of the patterned multi-layered structures may decrease as a distance between the substrate and the patterned multi-layered structures increases. Patterning the multi-layered structures may include performing a plurality of etching processes that have different etching regions from each other and have different etching depths from each other.

Forming the sacrificial spacer may include forming a sacrificial spacer layer to conformally cover the stacked structure including the plurality of multi-layered structures, and anisotropically etching the sacrificial spacer layer such that the forming of the sacrificial spacer produces a plurality of sacrificial spacers. Each of the sacrificial spacers may be on a sidewall of one of the multi-layered structures such that the sidewall of the third layer in the one of the multi-layered structures is simultaneously exposed. The sacrificial spacer layer may be formed of a material having an etching selectivity with respect to the third layers.

Forming the recess region may include forming a plurality of recess regions by simultaneously recessing sidewalls of the third layers of the multi-layered structures. The method may include, after forming the plurality of recess regions, etching the second layers and the fourth layers of the multi-layered structures to expose end portions of the first layers and the third layers of the multi-layered structures at locations different from each other.

The method may include forming semiconductor patterns that penetrate the stacked structure in a cell array region. The substrate may include the cell array region in which memory cells are to be formed and a contact region adjacent to the cell array region, and the semiconductor patterns may be formed to be connected to the substrate.

The method may include patterning the stacked structure to form a trench between the semiconductor patterns, the trench exposing the substrate, removing the first layers and the third layers exposed by the trench to form undercut regions between the second layers and the fourth layers, and confinedly forming conductive patterns in the undercut regions, respectively. The method may include forming a data storing layer between the semiconductor patterns and the conductive patterns.

Embodiments may also be realized by providing a method of fabricating a three-dimensional semiconductor device that includes forming a stacked structure including a plurality of first layers, patterning the stacked structure to form at least one first step, the first step including a pair of the first layers having substantially a same width, forming a sacrificial spacer on a sidewall of a lower layer of the pair of the first layers, the sacrificial spacer exposing a sidewall of an upper layer of the pair of the first layers, and recessing the exposed sidewall of the upper layer to form a second step such that the first layers of each pair have different widths.

The method may include forming second layers between the plurality of first layers. The first and second layers may be alternately stacked, and the second layers may have an etching selectivity with respect to the first layers. A recess region may be formed by recessing the exposed sidewall of the upper layer, and the recess region may be a void between adjacent ones of the second layers. The method may include removing portions of the adjacent ones of the second layers to define the recess region.

Removing portions of the adjacent ones of the second layers defining the recess region may include simultaneously removing the sacrificial spacer. The method may include replacing the first layers with conductive patterns, and forming contact plugs in contact with the conductive patterns.

BRIEF DESCRIPTION OF THE DRAWINGS

Features will become apparent to those of ordinary skill in the art by describing in detail exemplary embodiments with reference to the attached drawings, in which:

FIGS. 5A to 5M illustrate cross-sectional views corresponding to xz cross-sectional planes of FIGS. 3 and 4 that depict stages in a method of fabricating a three-dimensional semiconductor device, according to an exemplary embodiment;

DETAILED DESCRIPTION

Figure 1:
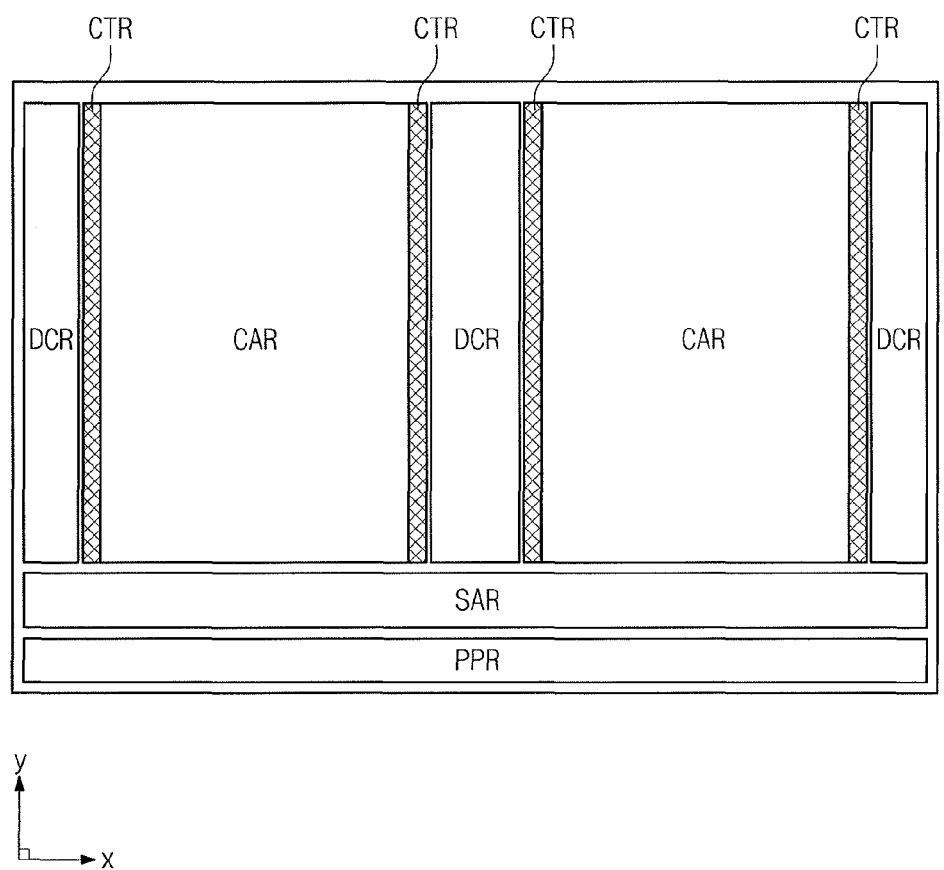
FIG. 1 illustrates a schematic block diagram of a three-dimensional semiconductor device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

It will be further understood that the terms "comprises", "comprising,", "includes" and/or "including", when used herein, specify the presence of stated features, stages, elements, and/or components, but do not preclude the presence or addition of one or more other features, stages, elements, components, and/or groups thereof.

The embodiments in the detailed description may be described with exemplary views. Shapes of the exemplary views may be modified according to, e.g., manufacturing techniques and/or allowable errors. Therefore, the embodiments should not be construed as limited to the specific shapes, e.g., shapes of regions, illustrated in the exemplary views, but may include other shapes that may be created according to, e.g., manufacturing processes. Areas exemplified in the drawings may have general properties, and may be used to illustrate exemplary shapes of elements. Exemplary embodiments should be construed as including deviations in shapes that result, e.g., from manufacturing. For example, an etching region illustrated as a rectangle may have rounded or curved features. Thus, the regions illustrated in the figures are schematic in nature and their shapes may vary and are not intended to limit the scope of exemplary embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings. Aspects of exemplary embodiments of explained and illustrated herein include their complementary counterparts.

FIG. 1 illustrates a schematic block diagram of a three-dimensional semiconductor device, according to an exemplary embodiment.

Referring to FIG. 1, a three-dimensional semiconductor device may include a cell array region CAR, a peripheral circuit region PPR, a sense amplifier region SAR, a decoding circuit region DCR, and a contact region CTR.

A plurality of memory cells, and bit lines and word lines for electrical connection of the memory cells may be disposed in the cell array region CAR. The word lines may extend from the cell array region CAR into the contact region CTR. The word lines may have a stepwise structure in the contact region CTR for, e.g., ease of electrical connection to circuits of the decoding circuit region DCR.

A word line driver, a row decoder, a column decoder, and control circuits may be disposed in the decoding circuit region DCR. The contact region CTR may be disposed between the cell array region CAR and the decoding circuit region DCR. An interconnection structure may be disposed in the contact region CTR. The interconnection structure may connect the word lines to the circuits of the decoding circuit region DCR. The interconnection structure may include contact plugs and interconnections.

Circuits for driving the memory cells may be disposed in the peripheral circuit region PPR. Circuits for sensing data stored in the memory cells may be disposed in the sense amplifier region SAR.

Figure 2:
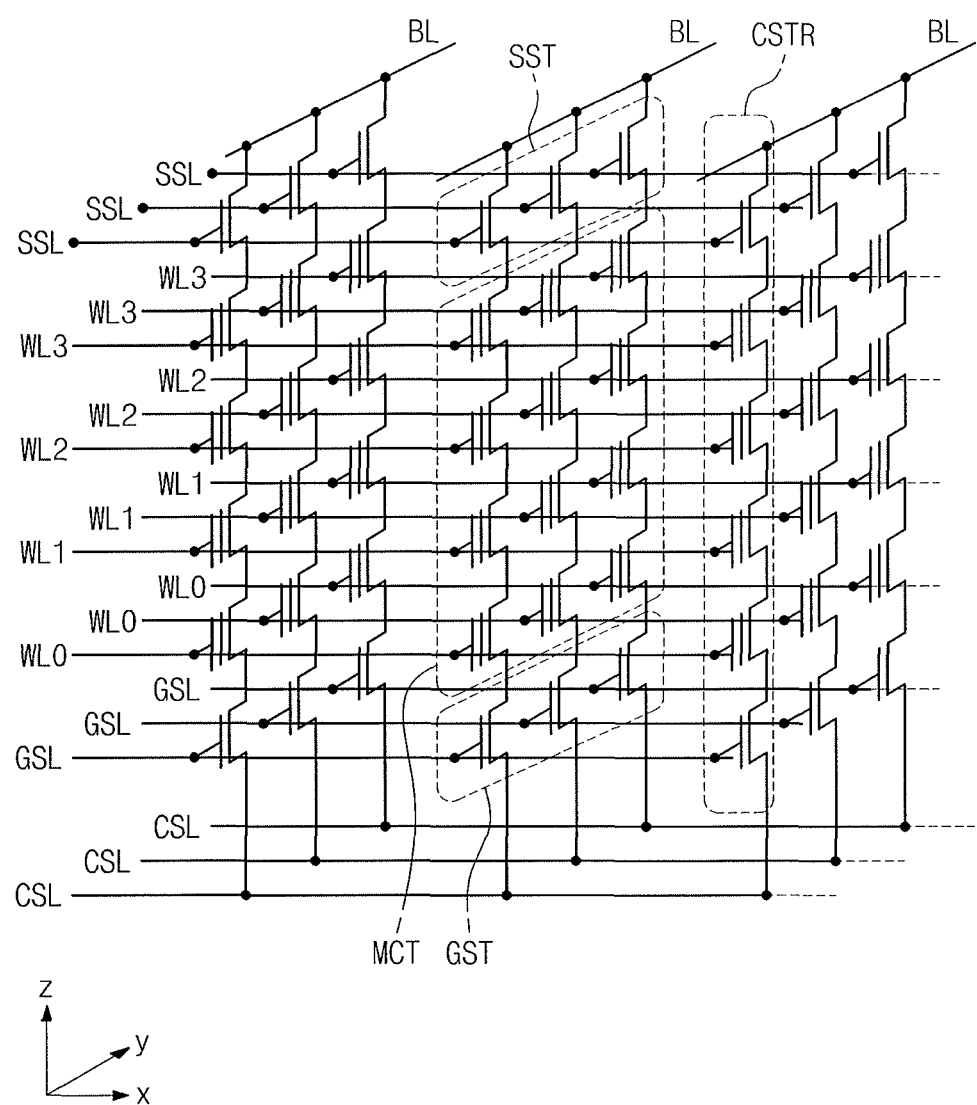
FIG. 2 illustrates a circuit diagram of a three-dimensional semiconductor device, according to an exemplary embodiment.
Figure 3:
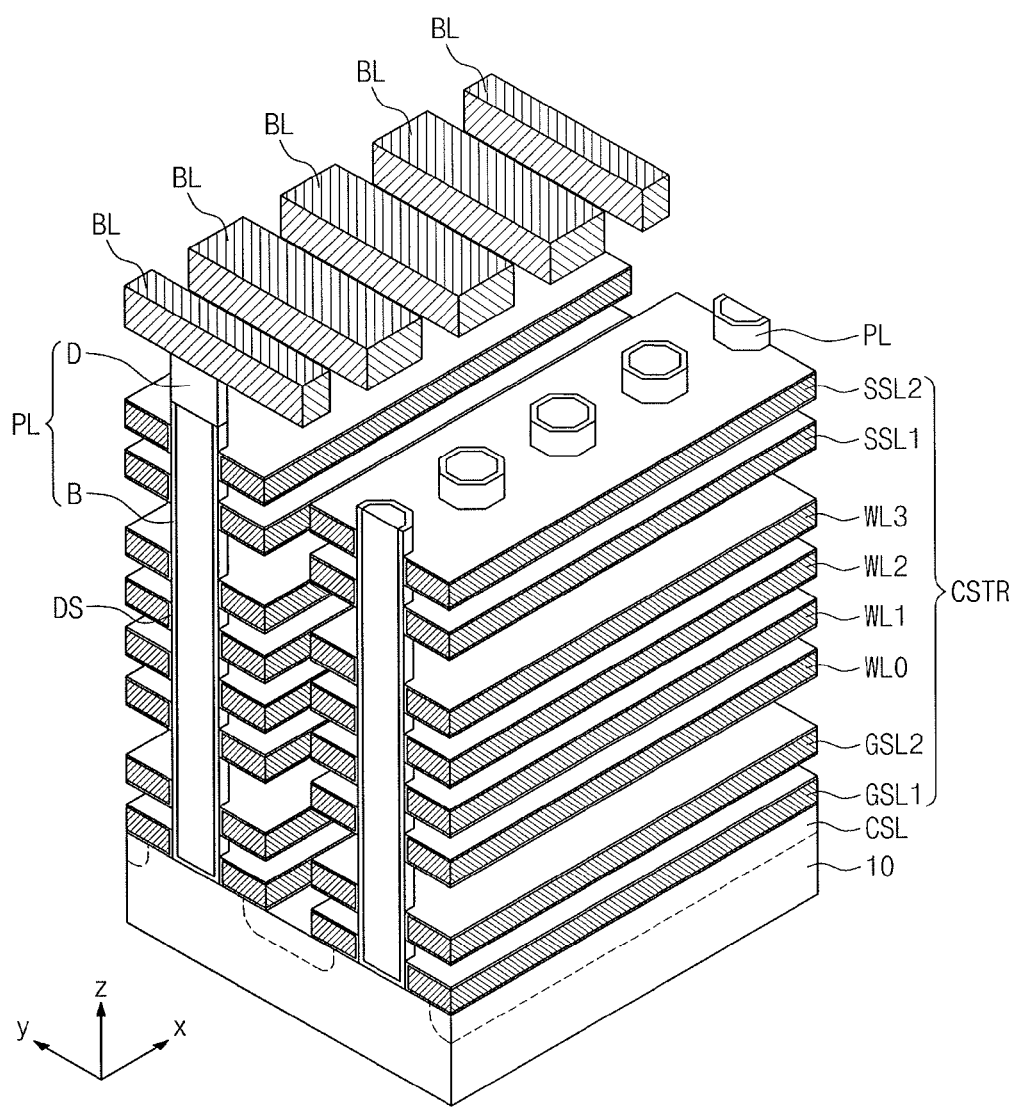
FIG. 3 illustrates a perspective view of a cell array of a three-dimensional semiconductor device, according to an exemplary embodiment.
Figure 4:
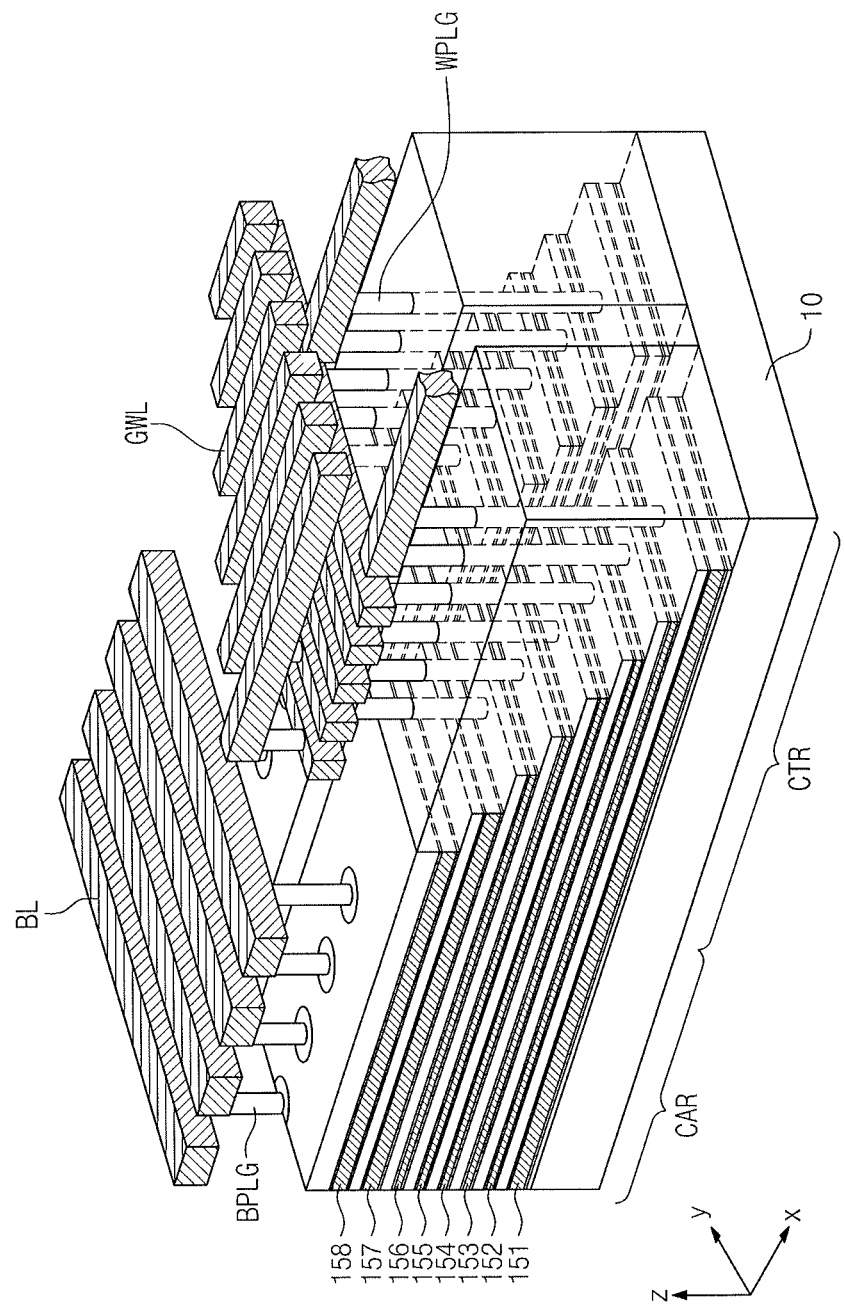
FIG. 4 illustrates a perspective view of an interconnection structure connected to word lines of a three-dimensional semiconductor device, according to an exemplary embodiment.

FIG. 2 illustrates a circuit diagram of a three-dimensional semiconductor device, according to an exemplary embodiment. FIG. 3 illustrates a perspective view of a cell array of a three-dimensional semiconductor device, according to an exemplary embodiment. FIG. 4 illustrates a perspective view of an interconnection structure connected to word lines of a three-dimensional semiconductor device, according to an exemplary embodiment.

Referring to FIG. 2, a cell array of a three-dimensional semiconductor device according to an exemplary embodiment may include at least one common source line CSL, a plurality of bit lines BL, and a plurality of cell strings CSTR disposed between the common source lines CSL and the bit lines BL.

The bit lines BL may be two-dimensionally arranged, e.g., in a plane including the x-axis and the y-axis. A plurality of the cell strings CSTR may be connected in parallel to each of the bit lines BL, e.g., extending along the z-axis direction. Ones of the cell strings CSTR may be commonly connected to the common source line CSL. That is, ones of the plurality of the cell strings CSTR may be arranged between a plurality of the bit lines BL and one common source line CSL. In an exemplary embodiment, the common source line CSL may be provided in a plural number and the common source lines CSL may be two-dimensionally arranged, e.g., in a plane including the x-axis and the y-axis. The same voltage may be applied to the common source lines CSL. Alternatively, the common source lines CSL may be electrically controlled independently of each other.

Each of the cell strings CSTR may include, e.g., a ground selection transistor GST connected to the common source line CSL, a string selection transistor SST connected to the bit line BL, and a plurality of memory cell transistors MCT between the ground and string selection transistors GST and SST. The ground selection transistor GST, the memory cell transistors MCT, and the string selection transistor SST may be connected in series.

The common source line CSL may be connected to sources of the ground selection transistors GST. A ground selection line GSL, a plurality of word lines WL0 to WL3, a plurality of string selection lines SSL, which are disposed between the common source line CSL and the bit lines BL, may be used as gate electrodes of the ground selection transistor GST, the memory cell transistors MCT, and the string selection transistors SST, respectively. Each of the memory cell transistors MCT may include a data storage element.

Referring to FIG. 3, a common source line CSL may be an impurity region that is formed in a substrate 10 or a conductive layer on the substrate 10. Bit lines BL may be conductive patterns (e.g. metal lines) that are disposed over the substrate 10. The bit lines BL may be two-dimensionally arranged and a plurality of cell strings CSTR may be connected in parallel to each of the bit lines BL. Thus, the cell strings CSTR may be two-dimensionally arranged on the common source line CSL or the substrate 10.

Each of the cell strings CSTR may include a plurality of ground selection lines GSL1 and GSL2, a plurality of word lines WL0 to WL3, and a plurality of string selection lines SSL1 and SSL2 that are disposed between the common source line CSL and the bit lines BL. In an exemplary embodiment, the plurality of string selection lines SSL1 and SSL2 may constitute the string selection line SSL of FIG. 2, and the plurality of ground selection lines GSL1 and GSL2 may constitute the ground selection line GSL of FIG. 2. The ground selection lines GSL1 and GSL2, the word lines WL0 to WL3, and the string selection lines SSL1 and SSL2 may be conductive patterns stacked, e.g., sequentially stacked, on the substrate 10.

Each of the cell strings CSTR may include a semiconductor pillar PL (or vertical semiconductor pattern), which may extend vertically from the common source line CSL and may be connected to the bit line BL. The semiconductor pillar PL may penetrate the ground selection lines GSL1 and GSL2, the word lines WL0 to WL3, and the string selection lines SSL1 and SSL2. For example, the semiconductor pillar PL may penetrate a stacked structure, and the stacked structure may include a plurality of conductive patterns stacked on the substrate 10. The semiconductor pillar PL may include a body portion B and at least one impurity region D. The impurity region D may be formed in one or two end portions of the semiconductor pillar PL. For example, the impurity region D formed in a top end portion of the semiconductor pillar PL, e.g., between the body portion B and the bit line BL, of the semiconductor pillar PL may be a drain region.

A data storing layer DS may be disposed between the word lines WL0 to WL3 and the semiconductor pillars PL. In an exemplary embodiment, the data storing layer DS may include a charge storing layer in which electrical charges may be stored. For example, the data storing layer DS may include at least one of a trap insulating layer, a floating gate electrode, and an insulating layer with conductive nano dots.

A dielectric layer serving as, e.g., a gate dielectric layer of vertical transistor, may be disposed between the ground selection lines GSL1 and GSL2 and the semiconductor pillar PL and/or between the string selection lines SSL1 and SSL2 and the semiconductor pillar PL. In an exemplary embodiment, the dielectric layer may be formed of the same material as the data storing layer DS. Alternatively, the dielectric layer may be formed of a material, e.g. silicon oxide, different from the data storing layer DS.

The semiconductor pillar PL may serve as, e.g., a channel region of a metal-oxide-semiconductor field effect transistor (MOSFET). The ground selection lines GSL1 and GSL2, the word lines WL0 to WL3, and the string selection lines SSL1 and SSL2 may serve as, e.g., gate electrodes of the MOSFETs. The word lines WL0 to WL3 may serve as gate electrodes of, e.g., memory cell transistors, and the ground selection lines GSL1 and GSL2 and the string selection lines SSL1 and SSL2 may serve as gate electrodes of, e.g., selection transistors. The selection transistors may be, e.g., configured to control an electrical connection between the bit line BL or the common source line CSL, and the channel region of the memory cell transistor. According to an exemplary embodiment, the semiconductor pillar PL may constitute MOS capacitors along with the ground selection lines GSL1 and GSL2, the word lines WL0 to WL3, and the string selection lines SSL1 and SSL2.

Energy band structures of the semiconductor pillars PL may be controlled by voltages applied to the ground selection lines GSL1 and GSL2, the word lines WL0 to WL3, and the string selection lines SSL1 and SSL2. For example, portions of the semiconductor pillars PL adjacent to the word lines WL0 to WL3 may become in an inversion state due to, e.g., the voltages applied to the word lines WL0 to WL3. Other portions of the semiconductor pillars PL between the word lines WL0 to WL3 may also become in an inversion state due to a fringe field generated from the word lines WL0 to WL3. According to an exemplary embodiment, the word lines WL0 to WL3 and the selection lines SSL1 and SSL2 may be formed closely in such a way that a distance between two adjacent ones of them is shorter than half a vertical width of an inversion region induced by the fringe field. For example, depending on the voltages applied to the lines GSL1, GSL2, SSL1, SSL2, and WL0 to WL3, the inversion regions may vertically overlap with each other, and the common source line CSL may be electrically connected to a selected bit line.

According to an exemplary embodiment, the cell string CSTR may be configured so that the selection transistors (e.g., ground and string selection transistors including the ground and string selection lines GSL1, GSL2, SSL1 and SSL2) and the memory cell transistors (e.g., MCT of FIG. 2) may be electrically connected in series.

The ground and string selection lines GSL1, GSL2, SSL1, and SSL2 and the word lines WL0 to WL3 corresponding to gate electrodes of the ground and string selection transistors and the memory cell transistors may constitute a gate structure. As illustrated in FIG. 4, the gate structure including gate electrodes 151 to 158 may extend from the cell array region CAR into the contact region CTR. The gate structure may have stepwise shape in the contact region CTR for, e.g., ease of electrical connection to circuits of the decoding circuit region.

As illustrated in FIG. 4, each of the gate electrodes 151 to 158 may have an end portion to which a word line contact plug WPLG is connected. Each of the gate electrodes 151 to 158 may be arranged on different floors on the substrate. The end portions of the gate electrodes 151-158 may be exposed for one-to-one connection of the gate electrodes 151-158 and the word line contact plugs WPLG. For example, each of the word line contact plugs WPLG may be connected to an exposed end portion of one of the gate electrodes 151-158. The exposed end portions of the gate electrodes 151-158 may form the stepwise shape in the contact region CTR so that a lowermost gate electrode, e.g., gate electrode 151, may have a greater area than an uppermost gate electrode, e.g., gate electrode 158. The word line contact plugs WPLG connected to the gate electrodes located in the same floor on the substrate may be commonly connected to a global word line GWL.

For formation of the gate structure having the stepwise shape in the contact region CTR, a plurality of lithography processes and a plurality of etching processes may be performed after a plurality of layers are stacked on the substrate 10. However, since the plurality of lithography processes and the plurality of etching processes are performed to form the gate structure having the stepwise shape, the processes and the number of the processes provided to some of the stacked layers in the stacked structure may be different from those provided to other stacked layers in the stacked structure. Accordingly, widths of the end portions of the gate electrodes may be non-uniform. In contrast, embodiments may provide methods of forming gate electrodes having end portions with substantially uniform widths. Further, embodiments may provide methods of reducing the processes and the number of the processes applied to the stacked layers.

Hereinafter, methods of fabricating a three-dimensional semiconductor device according to an exemplary embodiment will be described with reference to FIGS. 4, 5A to 5M, 6A to 6G, and 7A to 7D in more detail.

FIGS. 5A through 5M illustrate cross-sectional views corresponding to xz cross-sectional planes of FIGS. 3 and 4 that depict stages in a method of fabricating a three-dimensional semiconductor device, according to an exemplary embodiment. FIGS. 6A through 6G illustrate cross-sectional views corresponding to yz cross-sectional planes of FIGS. 3 and 4 that depict stages in a method of fabricating a three-dimensional semiconductor device, according to an exemplary embodiment. FIGS. 7A through 7D illustrate enlarged views of a portion 'A' of FIG. 6G, according to an exemplary embodiment.

Figure 5A:
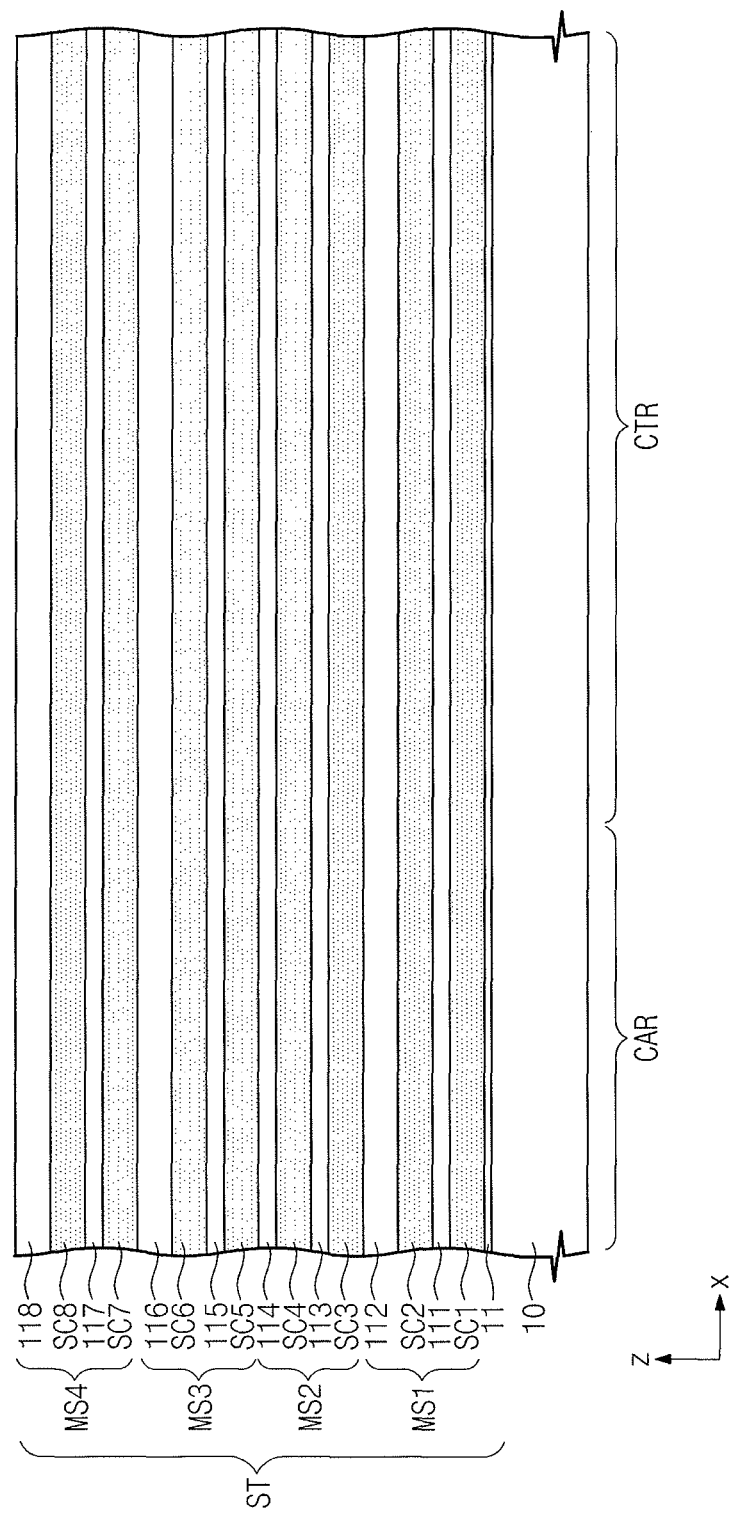
Figure 6A:
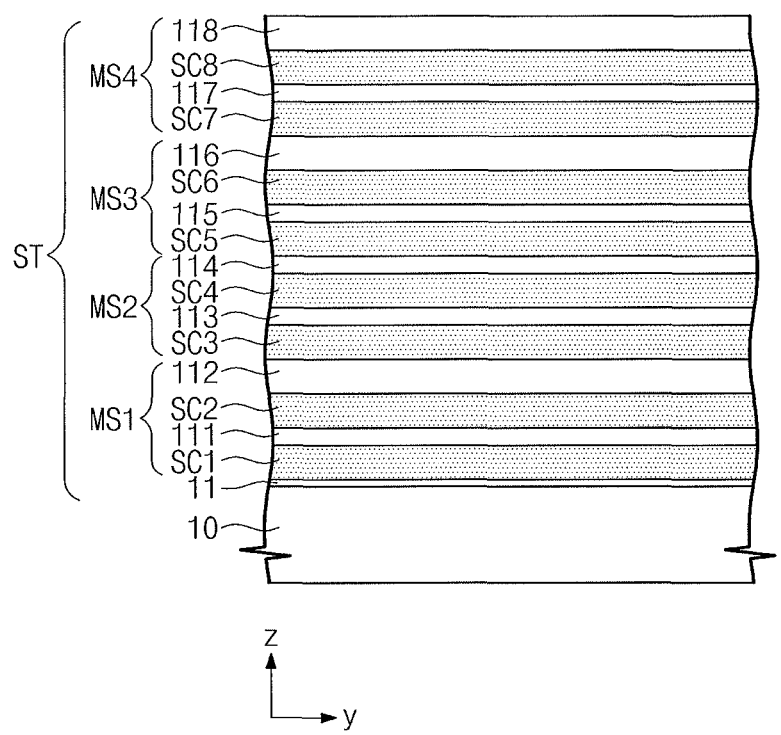
FIGS. 6A to 6G illustrate cross-sectional views corresponding to yz cross-sectional planes of FIGS. 3 and 4 that depict stages in a method of fabricating a three-dimensional semiconductor device, according to an exemplary embodiment.

Referring to FIGS. 5A and 6A, a stacked structure ST may be formed on a substrate 10. The substrate 10 may include a cell array region CAR and a contact region CTR. As described with reference to FIGS. 1 and 2, memory cell transistors being three-dimensionally arranged may be formed in the cell array region CAR. An interconnection structure may be formed in the contact region CTR. The interconnection structure may connect gate electrodes of the memory cell transistors in the cell array region CAR to peripheral circuits (e.g. decoders).

The substrate 10 may include a material having semiconductor characteristics, e.g. a silicon wafer, an insulating material, e.g. glass, a semiconductor material covered by an insulating material, and/or a conductor material. For example, the substrate 10 may be a silicon wafer having a first conductivity type.

According to an exemplary embodiment, the stacked structure ST may include a plurality of multi-layered structures, e.g., MS1 to MS4, sequentially stacked thereon. Each of the multi-layered structures MS1 to MS4 may include first, second, third, and fourth layers sequentially stacked therein. For example, first, second, third, and fourth multi-layered structures MS1, MS2, MS3, and MS4 may be stacked on the substrate 10. However, embodiments are not limited to the number of the multi-layered structures MS1 to MS4 described above. For example, five or more floors of multi-layered structures may be stacked on the substrate 100.

In the multi-layered structures MS1 to MS4, the first layer and the third layer may be formed of the same material, and the second layer and the fourth layer may be formed of the same material. The second layer may be disposed between the first layer and the third layer, and the third layer may be disposed between the second layer and the fourth layer. The second layer may have an etching selectivity with respect to the first and third layers. For example, the first layer may be formed of an insulating material having an etching selectivity with respect to an insulating material of the second layer. For example, the first and third layers may be sacrificial layers. According to another exemplary embodiment, the first and third layers may be formed of a conductive material, and the second and fourth layers may be formed of an insulating material.

Each of the multi-layered structures MS1 to MS4 may include the first to fourth layers sequentially stacked therein and the stacked structure ST may include the plurality of the multi-layered structures MS1 to MS4 sequentially stacked therein. Thus, according to an exemplary embodiment, two materials having different etch rates with respect to each other may be alternately and repeatedly stacked to form the stacked structure ST. A lower gate insulating layer 11 may be formed between the lowermost layer of the multi-layered structures MS1 to MS4 and the substrate 10. The lower gate insulating layer 11 may be the lowermost layer of the stacked structure ST. The lower gate insulating layer 11 may be formed of, e.g., a thermal oxide layer.

The stacked structure ST may include a plurality of insulating layers 111 to 118 and a plurality of sacrificial layers SC1 to SC8. In an exemplary embodiment, the number of the insulating layers 111 to 118 and the sacrificial layers SC1 to SC8 in the stacked structure ST may be 2n where n is a positive integer. Each of the first to fourth multi-layered structures MS1 to MS4 may include two floors of the sacrificial layers and two floors of the insulating layers, e.g., the two floors of the sacrificial layers and the two floors of the insulating layers may be alternately stacked.

As illustrated in FIGS. 5A and 6A, the insulating layers 111 to 118 and the sacrificial layers SC1 to SC8 may be alternately and repeatedly stacked through deposition processes. The sacrificial layers SC1 to SC8 may be formed of a material having an etching selectivity with respect to the insulating layers 111 to 118 in, e.g., a wet etching process. For example, the insulating layers 111 to 118 may include at least one of a silicon oxide layer, a silicon nitride layer, a silicon carbide layer, and a silicon oxycarbide. The sacrificial layers SC1 to SC8 may include at least one different from the insulating layers 111 to 118 and include at least one of a silicon oxide layer, a silicon nitride layer, a silicon carbide layer, and a silicon oxycarbide. In an exemplary embodiment, the insulating layers 111 to 118 may be formed of silicon oxide layers. Additionally, each of the insulating layers 111 to 118 may include a high-k dielectric layer for, e.g., ease of generating the inversion regions described with reference to FIG. 3. The high-k dielectric layer may include at least one high-k dielectric layer, e.g. a silicon nitride layer and/or a silicon oxynitride layer, having a dielectric constant higher than that of silicon oxide.

In an exemplary embodiment, thicknesses of the sacrificial layers SC1 to SC8 may determine channel lengths of the selection and memory cell transistors (SST, GST, and MCT in FIG. 3) described with reference to FIG. 3. In some embodiments, the insulating layers 111 to 118 may be formed in such a way that two adjacent inversion regions induced by the fringe field may overlap with each other. For example, an electric path passing through each of the cell strings may be adjustably formed depending on voltages applied to the gate electrodes.

In some exemplary embodiments, the sacrificial layers SC1 to SC8 may be formed to have substantially the same thickness, e.g., in the z-axis direction. In other exemplary embodiments, the lowermost and uppermost sacrificial layers SC1 and SC8 of the sacrificial layers SC1 to SC8 may be thicker than other sacrificial layers SC2 to SC7 interposed therebetween. The intervening sacrificial layers SC2 to SC7 may be formed to have substantially the same thickness.

The insulating layers 111 to 118 may be formed to have substantially the same thickness. Alternatively, the uppermost insulating layer 118 may be thicker than other insulating layers 111 to 117 disposed thereunder. For example, the underlying insulating layers 111 to 117 may be formed to have the substantially same thickness. In another exemplary embodiment, at least one of the insulating layers 111 to 118 (for instance, insulating layers between the lower selection line and/or the word line and between the upper selection line and the word line in FIG. 3) may be thicker than one of the remaining insulating layers, e.g., as shown in FIG. 5A.

Figure 5B:
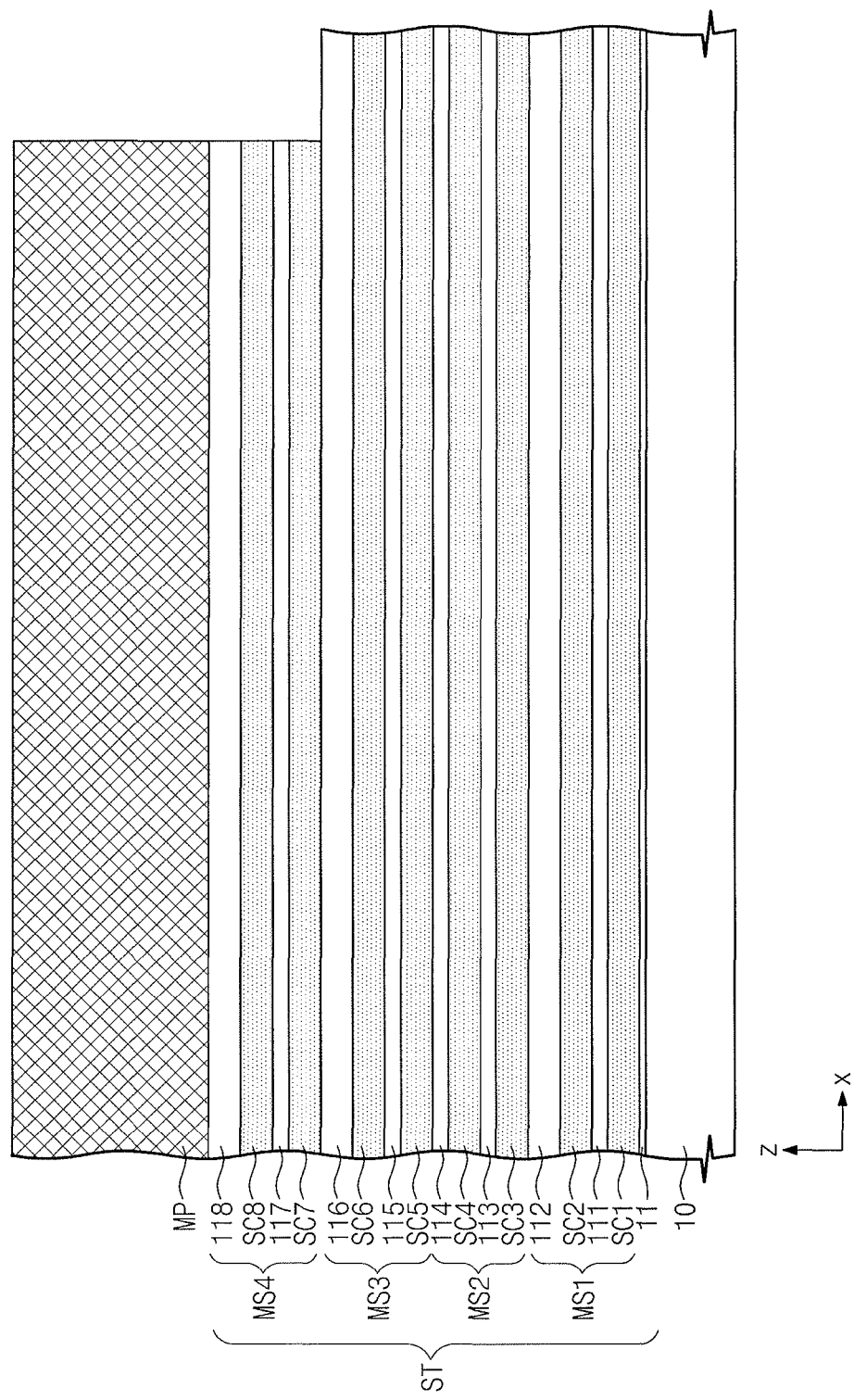
Figure 5C:
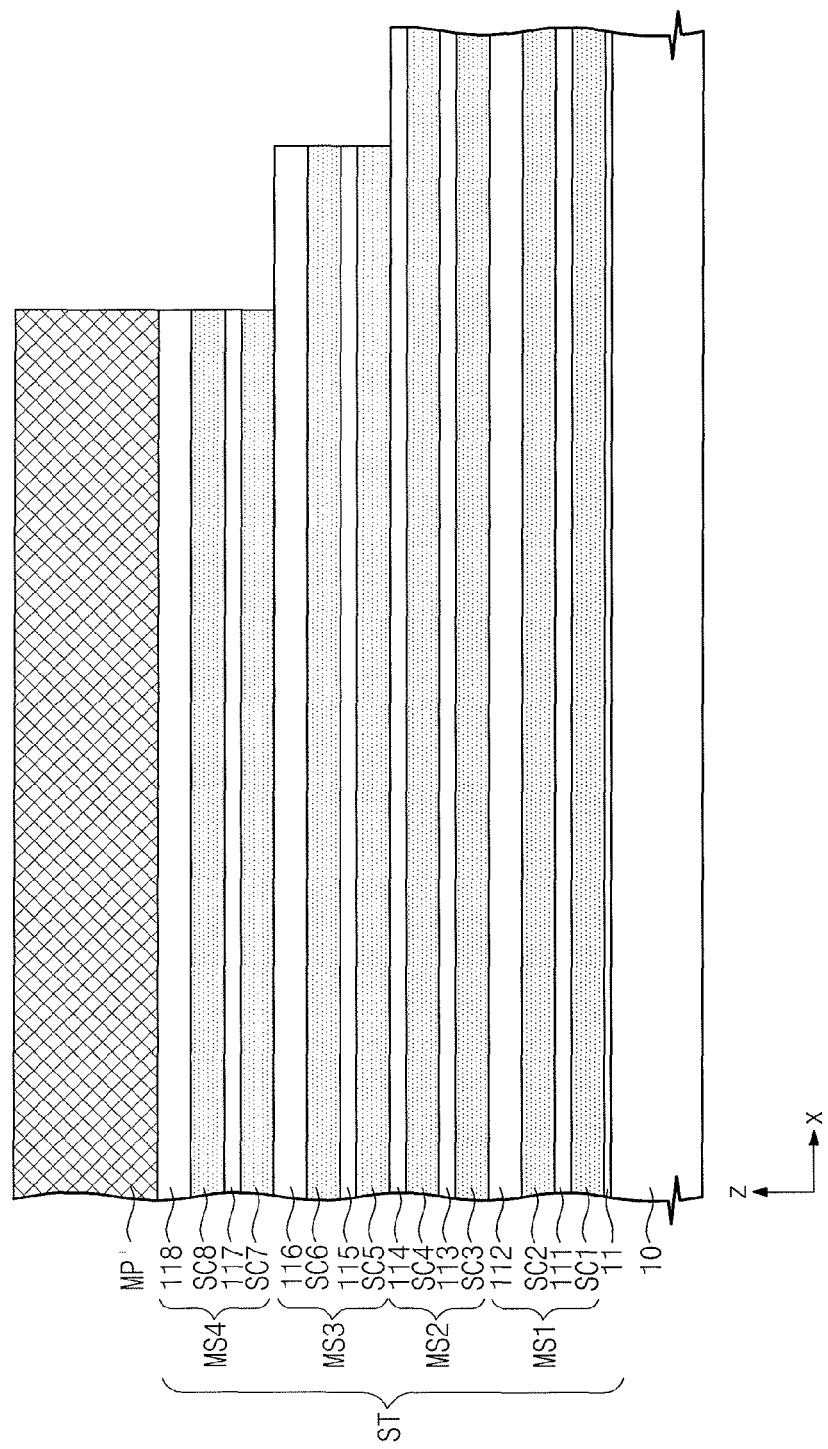
Figure 5E:
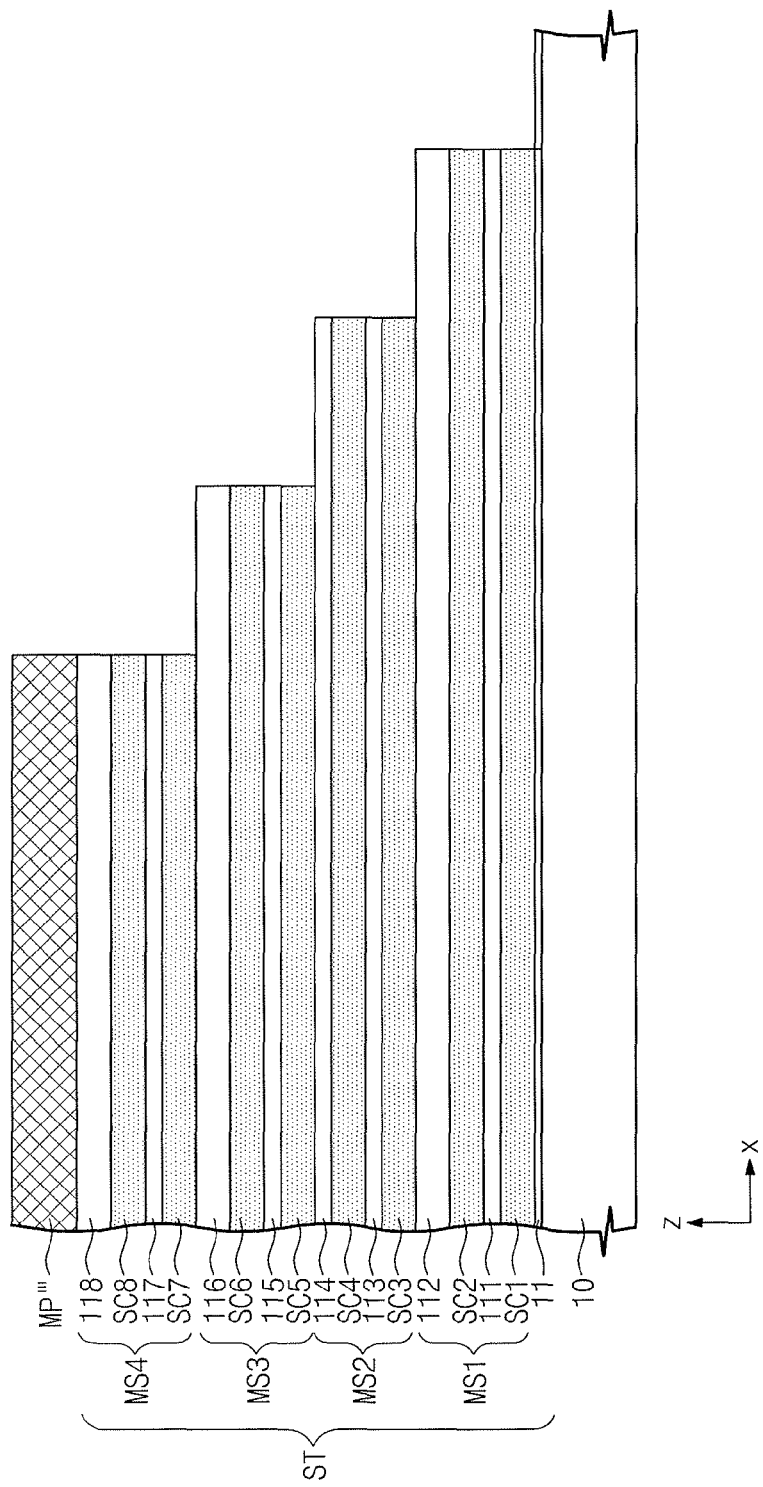

Referring to FIGS. 5B through 5E, the stacked structure ST may be patterned so that the stacked structure ST has a stepwise shape in the contact region CTR, e.g., the stacked structure ST may be patterned using a plurality of stages. As depicted in FIG. 5E, the stacked structure ST may be patterned so that end portions of the stacked multi-layered structures MS1 to MS4 may be exposed at locations different from each other. For example, the end portions, e.g., the exposed end portions, of the patterned multi-layered structures MS1 to MS4 may be disposed at locations different, e.g., in the x-axis direction, from each other.

In an exemplary embodiment, the patterning of the stacked structure ST may include sequentially exposing the end portions of the first to fourth multi-layered structures MS1 to MS4. For example, the patterning of the stacked structure ST may include sequentially exposing one end portion of each of the first to fourth multi-layered structures MS1 to MS4.

In another exemplary embodiment, one photolithography process may be performed for formation of the stacked structure ST having the stepwise shape. For example, for sequentially exposing the end portions of the first to fourth multi-layered structures MS1 to MS4, one mask pattern MP may be formed and then a trimming process reducing a horizontal area of the mask pattern MP may be performed in a plural number for a plurality of etching processes. For example, the plurality of etching processes may be performed with the one mask pattern MP having different horizontal areas. The patterning the stacked structure ST may include alternately and repeatedly performing the processes reducing the horizontal area of the mask pattern MP and the processes etching the stacked structure ST. In an exemplary embodiment, when the etching process may be performed in a plural number, the stacked structure ST may be etched by a thickness of one multi-layered structure MS1, MS2, MS3, or MS4, e.g., in each of the plural etching processes.

The process reducing the horizontal area of the mask pattern MP may enlarge a region exposed by the mask pattern MP. A width and a thickness of the mask pattern MP may be reduced as the processes etching the stacked structure ST may be repeatedly performed. At least a portion of the mask pattern MP may remain on the stacked structure ST until a lowermost insulating layer 111 through an uppermost insulating layer 118 are patterned. After the stacked structure ST having the stepwise shape is formed, the mask pattern MP may be removed.

In an exemplary embodiment, the process etching the stacked structure ST may vary according to the number of the multi-layered structures MS1 to MS4 being stacked. Etching amount of the stacked structure ST may be reduced in the process etching the stacked structure ST as the horizontal area of the mask pattern MP becomes reduced. The end portions of the multi-layered structures MS1 to MS4 may be sequentially exposed from the end portion of a lowermost multi-layered structure MS1 as the processes etching the stacked structure ST may be repeatedly performed.

For example, referring to FIG. 5B, the mask pattern MP on the stacked structure ST may be one of materials having an etching selectivity with respect to the insulating layers 111 to 118 and the sacrificial layers SC1 to SC8. In some embodiments, the mask pattern MP may include one of organic materials and photoresist materials. A thickness of the mask pattern MP may be greater than a width of the contact region CTR.

Subsequently, the stacked structure ST may be etched using the mask pattern MP by a first anisotropic etching process. Referring to FIG. 5B, the forth multi-layered structure MS4 disposed at an uppermost floor may be anisotropically etched. For example, two insulating layers 117 and 118 and two sacrificial layers SC7 and SC8, which are disposed in an uppermost portion of the stacked structure ST, may be etched.

Referring to FIG. 5C, a first trimming process may be performed to the mask pattern MP to form a mask pattern MP' having a reduced horizontal area. The trimming process may be performed by, e.g., an isotropic dry etching method or a wet etching method. The trimming process may be performed by, e.g., an entire surface etching method, so that a top surface as well as a sidewall of the mask pattern MP may be etched. As illustrated in FIGS. 5B through 5E, the width and the thickness of the mask pattern MP may be reduced as the trimming process is repeatedly performed.

A horizontal area of the stacked structure ST exposed in the contact region CTR may be enlarged by the first trimming process. Subsequently, the stacked structure ST may be anisotropically etched using the reduced mask pattern MP'. For example, the third and fourth multi-layered structures MS3 and MS4 may be anisotropically etched in the contact region CTR.

Referring to FIG. 5D, a second trimming process may be performed to the reduced mask pattern MP' to form a mask pattern MP'' of which a horizontal area becomes further reduced. An amount of area of the mask pattern reduced by the second trimming process may be substantially the same as that of the mask pattern by first trimming process. Subsequently, the stacked structure ST may be anisotropically etched using the reduced mask pattern MP''. For example, the second through fourth multi-layered structures MS2 to MS4 may be anisotropically etched.

Referring to FIG. 5E, a third trimming process may be performed to the reduced mask pattern MP'' to form a mask pattern MP''' of which a horizontal area becomes further reduced. The stacked structure ST may be anisotropically etched using the reduced mask pattern MP''', so that the first to fourth multi-layered structures MS1 to MS4 may be anisotropically etched.

As described above, the first to fourth multi-layered structures MS1 to MS4 may be accumulatively anisotropically etched. Accordingly, the end portions of the multi-layered structures MS1 to MS4 may be exposed at locations different, e.g., along the x-axis direction, from each other. A plurality of first steps may be formed with the first to fourth multi-layered structures MS1 to MS4. Each of the first to fourth multi-layered structures MS1 to MS4 may include a lower portion including one of the sacrificial layers SC1 to SC8 and including one of the insulating layers 111 to 118. Each of the first to fourth multi-layered structures MS1 to MS4 may include an upper portion including another one of the sacrificial layers SC1 to SC8 and another one of the insulating layers 111 to 118. As such, each of the first to fourth multi-layered structures MS1 to MS4 may include a pair of sacrificial layers, e.g., an upper sacrificial layer and a lower sacrificial layer, and a pair of insulating layers, e.g., an upper sacrificial layer and a lower sacrificial layer. For example, as illustrated in FIG. 5E, the stacked structure ST may have the stepwise shape in the contact region CTR. The patterning method of the stacked structure ST having the stepwise shape may be variously modified.

In FIG. 5E, when the end portions of the multi-layered structures MS1 to MS4 consisting of the first through fourth layers are exposed, top surfaces of the insulating layers 112, 114, 116 and 118, e.g., which are disposed at even number floors from a bottom end of the stacked structure ST, may be exposed.

The farther a distance from the multi-layered structures MS1 to MS4 to the substrate 10 is, the smaller the area occupied by the multi-layered structures MS1 to MS4 may be. As the multi-layered structures MS1 to MS4 may be vertically farther from the substrate 10, sidewalls of the multi-layered structures MS1 to MS4 may be laterally closer to the cell array region CAR. Distances between the sidewalls of the adjacent ones of the multi-layered structures MS1 to MS4 in the patterned stacked structure ST may be substantially uniform. For example, each step of the stepwise shape may expose a substantially uniform end portion of each of the multi-layered structures MS1 to MS4.

Figure 5F:
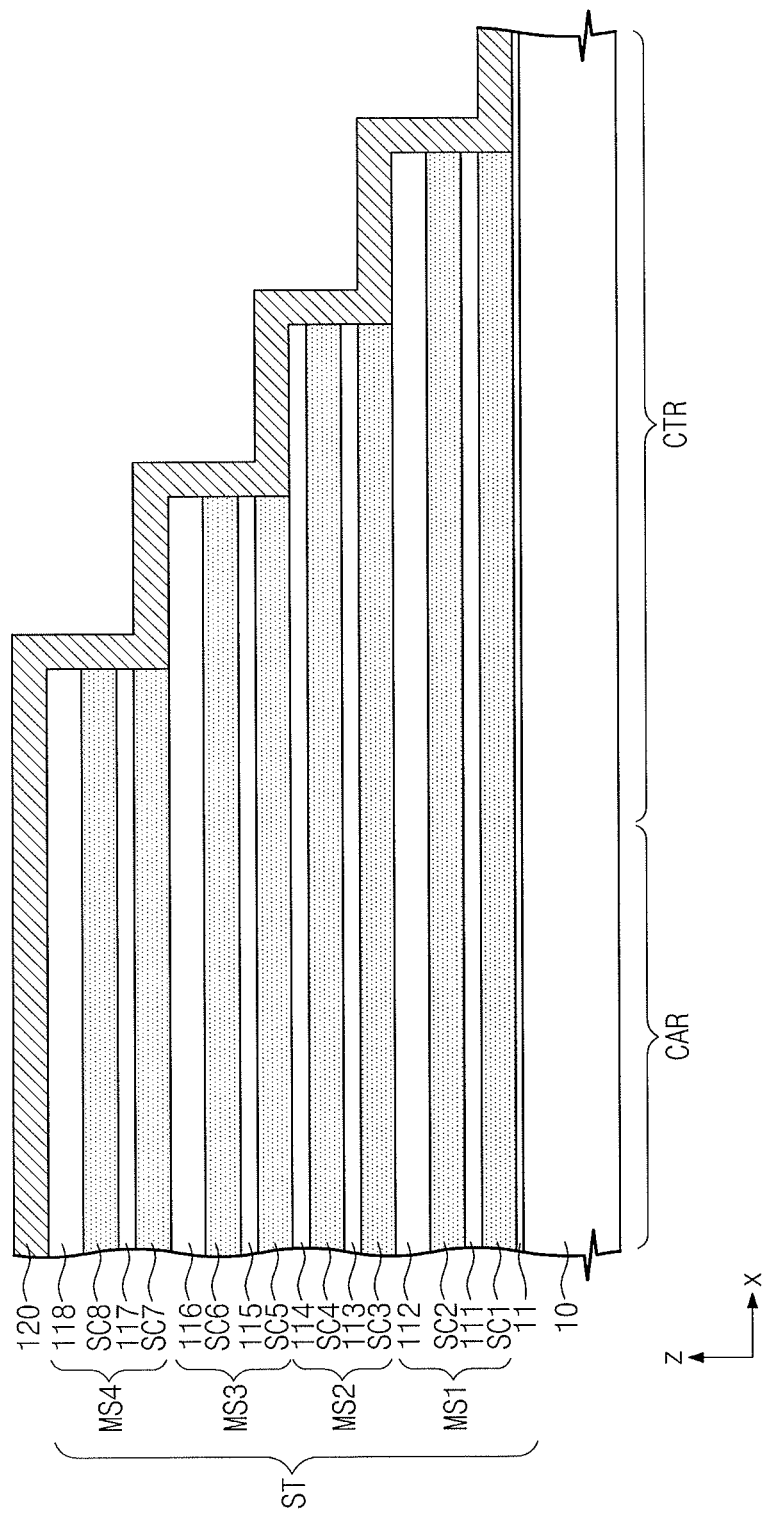

Referring to FIG. 5F, a sacrificial spacer layer 120 may be conformally formed on the stacked structure ST of which the end portions of the first to fourth multi-layered structures MS1 to MS4 have been exposed in the contact region CTR. For example, the sacrificial spacer layer 120 may cover, e.g., entirely cover, the sidewalls of the multi-layered structures MS1 to MS4. For example, the sacrificial spacer layer 120 may cover each of the sidewalls of the stepwise structure including the exposed end portions of the first to fourth multi-layered structures MS1 to MS4 in the contact region CTR.

The sacrificial spacer layer 120 may be formed of, e.g., a material having an etching selectivity with respect to the sacrificial layers SC1 to SC8 during a process of removing the sacrificial layers SC1 to SC8. In an exemplary embodiment, when the sacrificial layers SC1 to SC8 are formed of silicon nitride layers, the sacrificial spacer layer 120 may be formed of, e.g., a poly-silicon layer, a silicon oxide layer, a silicon oxynitride layer, a silicon carbide layer, a silicon oxycarbide layer, or any combination thereof. In another exemplary embodiment, when the sacrificial layers SC1 to SC8 are formed of conductive layers such as poly-silicon layers, the sacrificial spacer layer 120 may be formed of e.g., a silicon nitride layer, a silicon oxide layer, a silicon oxynitride layer, a silicon carbide layer, a silicon oxycarbide layer, or any combination thereof.

Figure 5G:
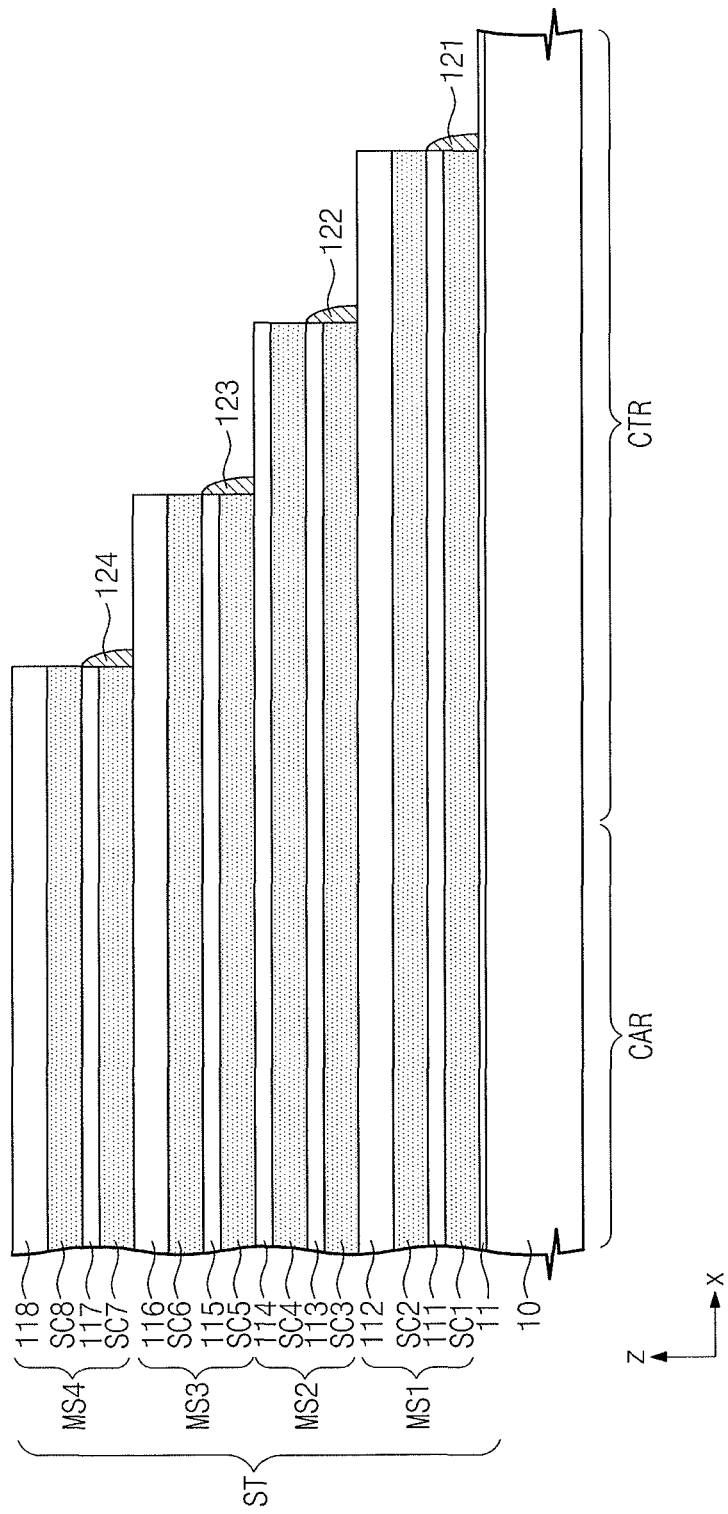

Referring to FIG. 5G, the sacrificial spacer layer 120 may be etched to forming sacrificial spacers 121 to 124 on the sidewalls of the first to fourth multi-layered structures MS1 to MS4, respectively, in the stacked structure ST having the stepwise shape. For example, the sacrificial spacer layer 120 may be anisotropically etched until the third layers of the multi-layered structures MS1 to MS4 are exposed to form the sacrificial spacers 121 to 124. The sacrificial spacers 121 to 124 may be formed on sidewalls of odd-numbered sacrificial layers SC1, SC3, SC5, and SC7 from the bottom end of the stacked structure ST. After the sacrificial spacers 121 to 124 are formed, the sidewalls of the even-numbered sacrificial layers SC2, SC4, SC6, and SC8, which may be disposed at even number floors from the bottom of the stacked structure ST including the lower gate insulating layer 11, may be exposed.

For example, the sacrificial spacer layer 120 may be etched so that sidewalls of upper portions, e.g., an upper one of the sacrificial layers and an upper one of the insulating layers, of each of the multi-layered structures MS1 to MS4 in the contact region CTR may be exposed, and sidewalls of lower portions, e.g., a lower one of the sacrificial layers and a lower one of the insulating layers, may remain covered by portions of the etched sacrificial spacer layer 120.

Figure 5H:
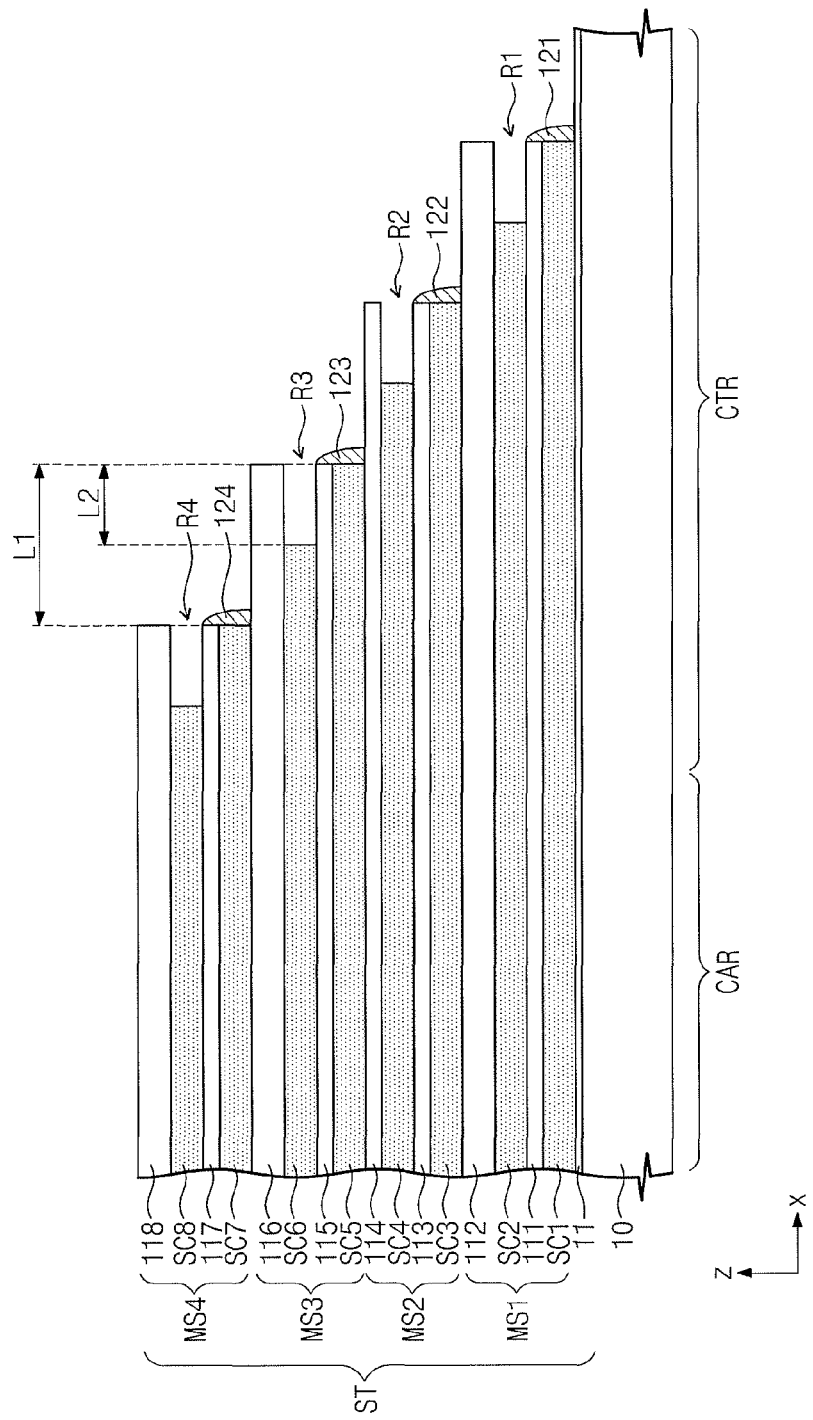

Referring to FIG. 5H, the third layers of the multi-layered structures MS1 to MS4 exposed by the sacrificial spacers 121 to 124 may be recessed, e.g., in the x-axis direction, to form recess regions R1 to R4, respectively. For example, an upper one of the sacrificial layers in each of the multi-layered structures MS1 to MS4 in the contact region CTR may be recessed to form the recess regions R1 to R4. Each of the recess regions R1 to R4 may be formed between the second layer and the fourth layer in each of the multi-layered structures MS1 to MS4. In this regard, a lateral edge of the third layers of the multi-layered structures MS1 to MS4 in the contact region CTR may be closer to the cell array region CAR than lateral edges of the adjacent second and fourth layers.

In an exemplary embodiment, the forming of the recess regions R1 to R4 may include, e.g., isotropically etching the third layers using a etch recipe having an etching selectivity with respect to the second and fourth layers. For example, the end portions of the even-numbered sacrificial layers SC2, SC4, SC6, and SC8 may be isotropically etched using an etch recipe having an etching selectivity with respect to the insulating layers 111 to 118. Thus, the recess regions R1 to R4 may be formed.

As described above, the recess regions R1 to R4 may be formed by the isotropic etching process, the sacrificial spacers 121 to 124 may be formed on sidewalls of the first layers of the multi-layered structures MS1 to MS4, and the sidewalls of the third layers may be laterally recessed. Thus, each of the recess regions R1 to R4 may be formed between the second layer and the fourth layer of each of the first to fourth multi-layered structures MS1 to MS4.

A horizontal depth L2 of each of the recess regions R1 to R4 may be less than a horizontal distance L1 between the sidewalls of a pair of the multi-layered structures, e.g., ones of the multi-layered structures MS1 to MS4, vertically adjacent to each other. According to an exemplary embodiment, the horizontal depth L2 of each of the recess regions R1 to R4 may be about a half of the horizontal distance L1 between the sidewalls of the pair of the multi-layered structures vertically adjacent to each other. The horizontal depth L2 may correspond to a void between the sidewalls of ones of the insulating layers 111-118 adjacent to each other.

After forming the recess regions R1 to R4, locations of the sidewalls of odd-numbered sacrificial layers SC1, SC3, SC5, and SC7 may not be changed, and the sidewalls of even-numbered sacrificial layers SC2, SC4, SC6, and SC8 may be moved closer toward the memory cell region CAR.

Figure 5I:
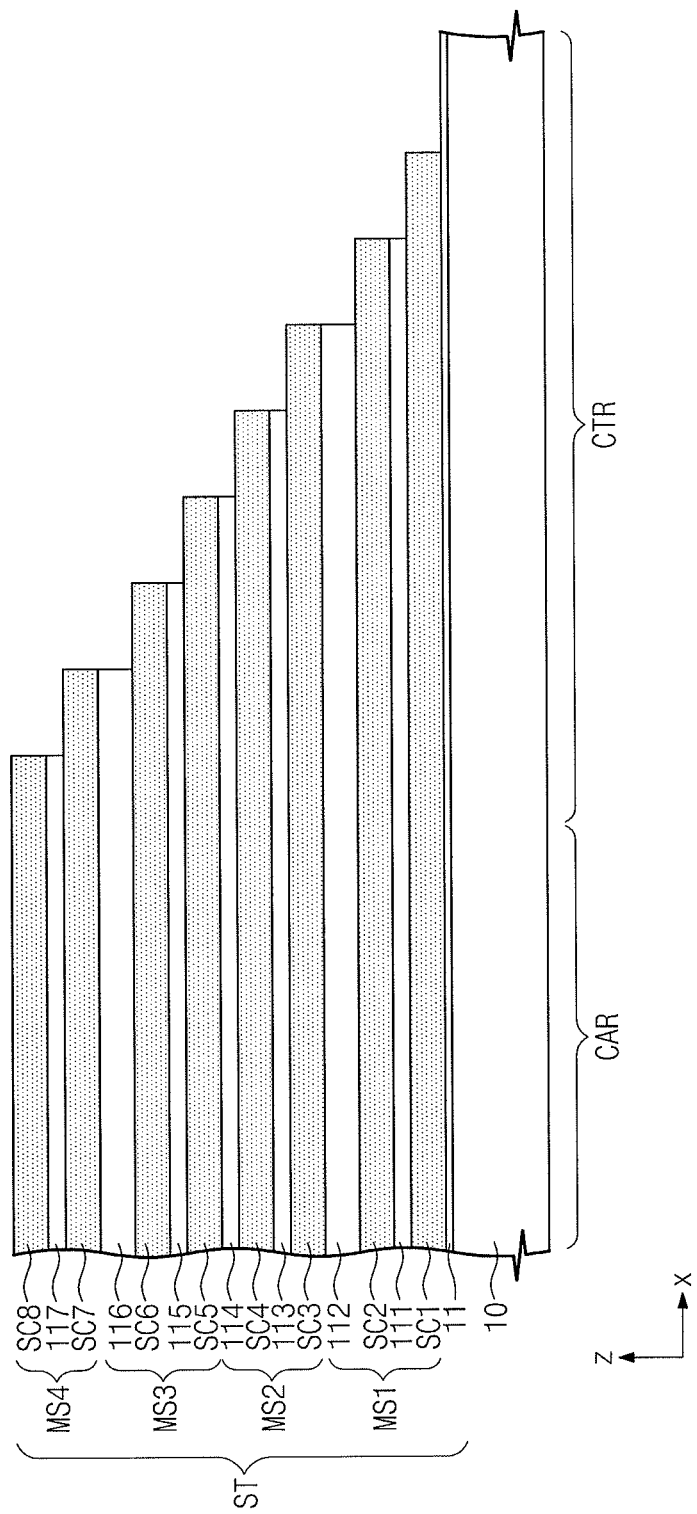

Referring to FIG. 5I, the recess regions R1 to R4 in the contact region CTR may be removed. Thus, the end portions of each of the sacrificial layers SC1 to SC8 in the stacked structure ST may be exposed at locations different, e.g., in the x-axis direction, from each other. For example, the removing of the recess regions R1 to R4 may include removing the sacrificial spacers 121 to 124 on the sidewalls of the multi-layered structures MS1 to MS4, and removing the uppermost insulating layer 118. The removing the recess regions R1 to R4 may also include removing portions, e.g., exposed portions, of the second layers and the fourth layers surrounding the recess regions R1 to R4.

In an exemplary embodiment, if the sacrificial spacers 121 to 124 are formed of a material different from the sacrificial layers SC1 to SC8 and the insulating layers 111 to 118, the sacrificial spacers 121 to 124 may be etched using an etch recipe having an etching selectivity with respect to the sacrificial layers SC1 to SC8 and the insulating layers 111 to 118. In another exemplary embodiment, if the sacrificial spacers 121 to 124 are formed of the same material as the insulating layers 111 to 118, the sacrificial spacers 121 to 124, and the insulating layers 111 to 118 defining the recess regions R1 to R4 may be etched together.

The removing of the recess regions R1 to R4 may include performing an entire surface anisotropic etching process to the stacked structure ST using an etch recipe having an etching selectivity with respect to the sacrificial layers SC1 to SC8. Thus, the uppermost insulating layer 118 may be etched to expose a top surface of an uppermost sacrificial layer SC8. And, the insulating layers 111-117 on the end portions of the sacrificial layers SC1 to SC7 under the uppermost sacrificial layer SC8 may be removed to expose the end portions of the sacrificial layers SC1 to SC7. The stacked structure ST may include a plurality of second steps. For example, the second steps may be formed by the sacrificial layers SC1 to SC7 in the contact region CTR having different widths from each other. The insulating layers 111-117 may also have different widths from each other in the contact region CTR to form the second steps.

According to an exemplary embodiment, each of the insulating layers 111-117 may be etched so that sidewalls thereof are vertically aligned with sidewalls of the ones of the sacrificial layers SC1 to SC7 adjacent thereto, e.g., each of the insulating layers 111-117 may be vertically aligned with the sidewalls of the ones of the sacrificial layers SC1 to SC7 directly above. Thus, it may be possible to form the stacked structure ST having the stepwise shape of which the end portions of the sacrificial layers SC1 to SC8 are exposed at locations different from each other. For example, the sidewalls of the sacrificial layers SC1 to SC8 may be laterally closer to the cell array region CAR as the sacrificial layers SC1 to SC8 are vertically farther from the substrate 10.

Subsequently, an interlayer insulating layer 130 may be formed on the stacked structure ST having the exposed end portions of the sacrificial layers SC1 to SC8. The interlayer insulating layer 130 may be formed to cover the stacked structure ST in both the cell array region CAR and the contact region CTR. The interlayer insulating layer 130 may be formed of, e.g., a material having an etching selectivity with respect to the sacrificial layers SC1 to SC8 in a process of removing the sacrificial layers SC1 to SC8 of the stacked structure ST. Alternatively, the interlayer insulating layer 130 may be formed of a material having an etching selectivity with respect to both the insulating layers 111 to 117 and the sacrificial layers SC1 to SC8 in the process of removing the sacrificial layers SC1 to SC8 of the stacked structure ST.

The interlayer insulating layer 130 may be formed using, e.g., a deposition technique such as a chemical vapor deposition (CVD) method. The interlayer insulating layer 130 may be conformally formed on the substrate 10 having the stacked structure ST. The interlayer insulating layer 130 may be thicker than a height of the stacked structure ST, e.g., in a region adjacent to the multi-layered structure MS1. The height of the interlayer insulating layer 130 may vary along the stepwise structure of the stacked structure ST. The interlayer insulating layer 130 may have a height difference between the cell array region CAR and the contact region CTR. Thus, after the interlayer insulating layer 130 is deposited, a planarization process may be performed to the interlayer insulating layer 130 for reduction of the height difference of the interlayer insulating layer 130. The planarization process may be, e.g., a chemical mechanical polishing (CMP) process or an etch-back process.

Subsequently, processes forming selection transistors and memory cell transistors on the substrate 10 may be performed.

Figure 5J:
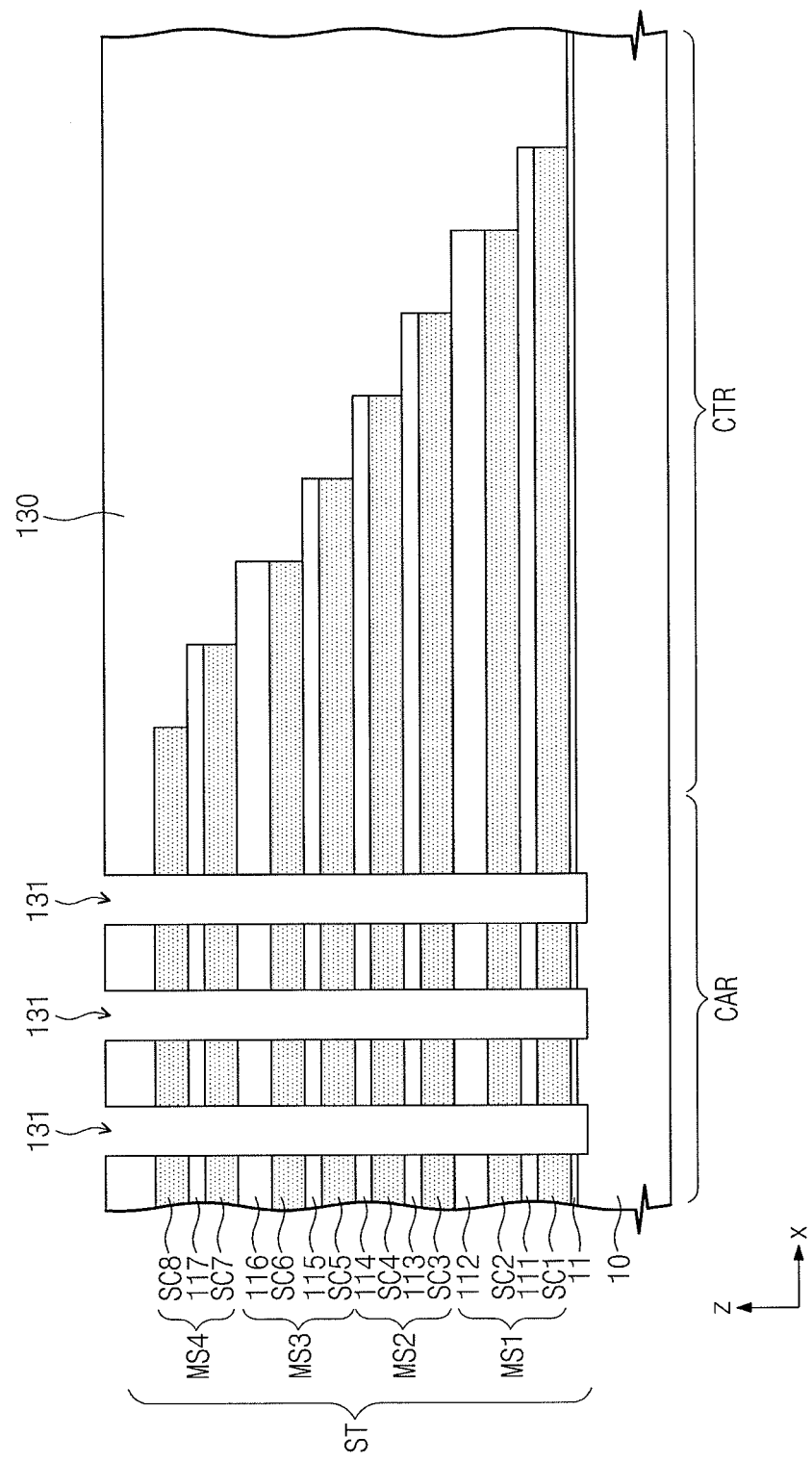
Figure 6B:
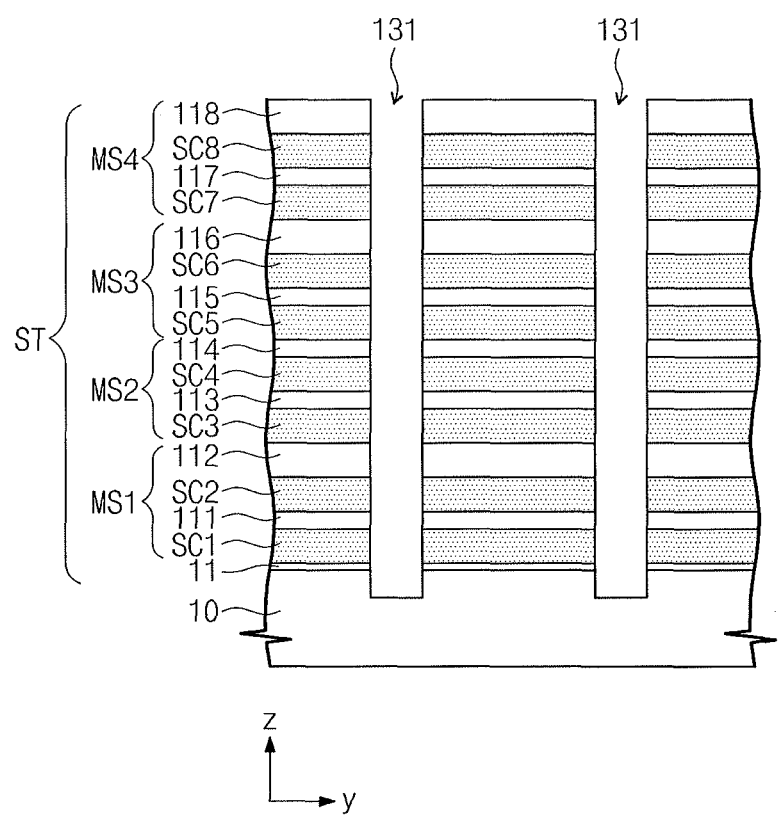

Referring to FIGS. 5J and 6B, the stacked structure ST having the stepwise shape and the interlayer insulating layer 130 formed thereon may be patterned to form openings 131 exposing the substrate 10 in the cell array region CAR. For example, the forming the openings 131 may include forming a mask pattern (not shown) defining the openings 131 on the stacked structure ST, and anisotropically etching the stacked structure ST using the mask pattern (not shown).

The openings 131 may expose sidewalls of the sacrificial layers SC1 to SC8 and the insulating layers 111 to 117. The openings 131 may penetrate the lower gate insulating layer 11 to expose the top surface of the substrate 10. In some embodiments, the top surface of the substrate 10 exposed by the openings 131 may be recessed by an over etch during the formation of the openings 131 so that a trench is formed in the substrate 10.

A depth of the opening 131 may be, e.g., at least five times greater than a width of the opening 131. Based on the anisotropic etching process, a width of the opening 131 may vary depending on a distance from the substrate 10. For example, the width of the opening 131 may be proportional to a distance from a top surface of the substrate 10.

In some embodiments, each of the openings 131 may be shaped like, e.g., a cylinder or rectangular parallelepiped. The openings 131 may be two-dimensionally arranged and/or regularly arranged on the top surface, e.g., the xy-plane of FIG. 4, of the substrate 10. For example, the openings 131 may be empty spaces spaced apart from each other.

In a plan view, each of the openings 131 may be shaped like a linear trench, and the linear openings 131 may be formed parallel with each other, according to an exemplary embodiment. In another exemplary embodiment, the openings 131 may be arranged in a zigzag manner with respect to each other. A density of the openings 131 may be increased due to the zigzag arrangement of the openings 131.

Figure 5K:
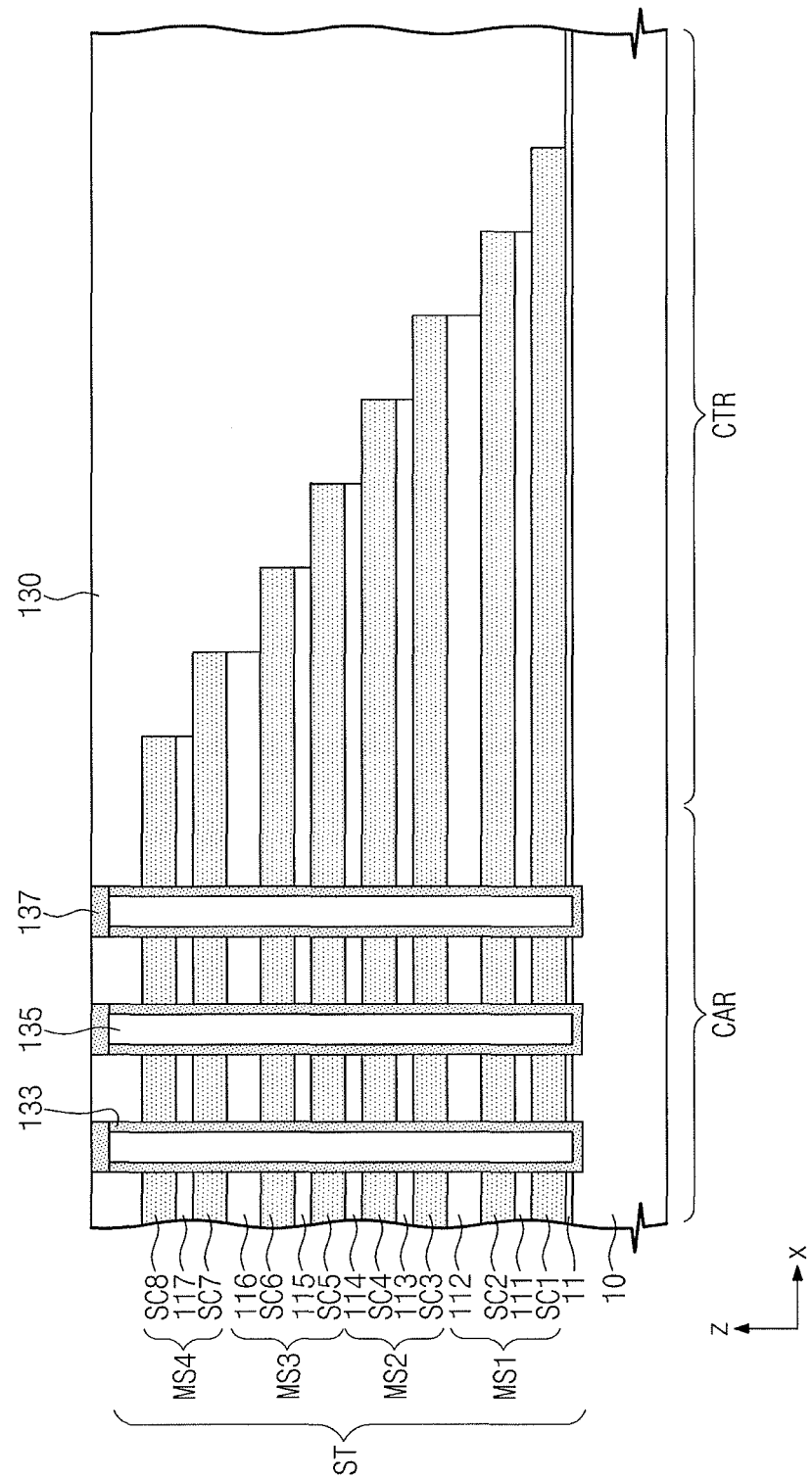
Figure 6C:
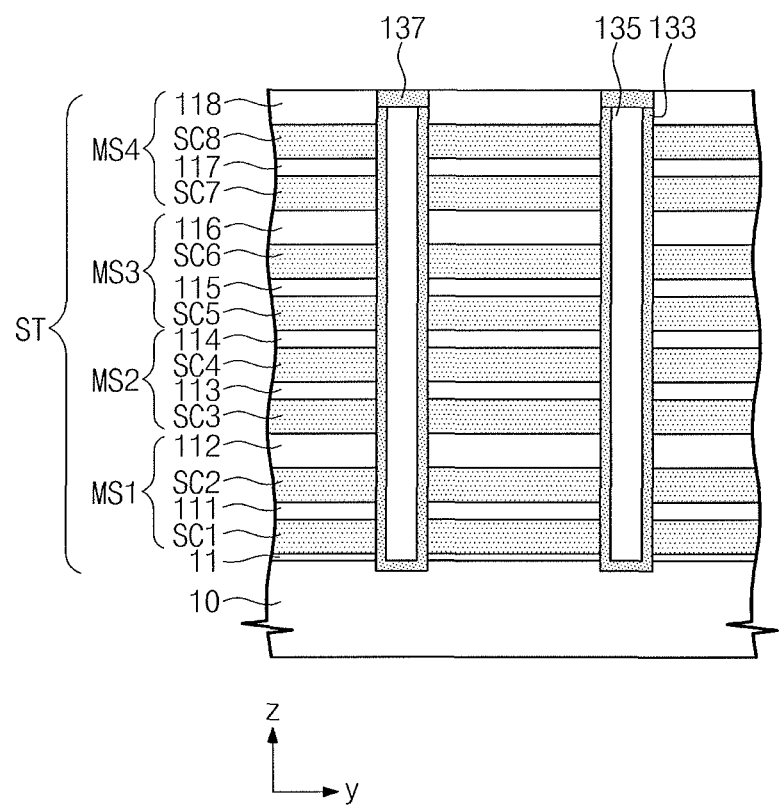

Referring to FIGS. 5K and 6C, semiconductor patterns 133 may be formed in the openings 131, respectively. For example, the semiconductor pattern 133 may include silicon, germanium, or any combination thereof. The semiconductor pattern 133 may be a semiconductor doped with dopants or an intrinsic semiconductor of an undoped state. The semiconductor pattern 133 may be formed to have one of a single-crystalline structure, an amorphous structure, or a polycrystalline structure.

The semiconductor patterns 133 may be formed in the openings 131 by, e.g., a chemical vapor deposition (CVD) process or an atomic layer deposition (ALD) process. In an exemplary embodiment, the semiconductor patterns 133 may include at least a single-crystalline structure obtained from a phase transition of an amorphous or polycrystalline silicon layer. The phase transition may be realized by, e.g., a thermal treatment such as a laser annealing process. In another exemplary embodiment, the semiconductor patterns 133 may be formed in the openings 131 by, e.g., an epitaxial process using the substrate 10 exposed by the openings 131 as a seed layer.

According to one exemplary embodiment, the formation of the semiconductor pattern 133 may include sequentially depositing a semiconductor layer and a gap-fill insulating layer on the stacked structure ST provided with the openings 131. Thereafter, a planarization process may be performed to expose a top surface of the stacked structure ST. The semiconductor layer may be deposited to have a smaller thickness than half the width of the opening 131. Accordingly, the semiconductor pattern 133 may partially fill the opening 131 and define an empty space in a central portion of the opening 131.

A thickness of the semiconductor pattern 133, e.g., a thickness of the semiconductor pattern 133 deposited on a sidewall of the opening 131, may be smaller than a width of a depletion region or than a mean size of poly-silicon grains constituting the semiconductor pattern 133, according to an exemplary embodiment. The depletion region may be formed in the semiconductor pattern 133 during operation of the semiconductor memory device. The semiconductor pattern 133 in the opening 131 may have a pipe shape, a hollow cylinder shape, or a cup shape. In the case that the semiconductor pattern 133 is formed using a deposition method, a discontinuous interface, e.g., an interface dislocation, may be formed between the semiconductor pattern 133 and the substrate 10 due to, e.g., a difference in crystal structure therebetween.

After forming the semiconductor pattern 133 and/or depositing the semiconductor layer, a gap-fill insulating pattern 135 may be formed to fill the empty space defined by the semiconductor pattern 133 and/or the semiconductor layer. The gap-fill insulating pattern 135 may be formed of, e.g., an insulating material having a good gap-fill property. For instance, the gap-fill insulating pattern 135 may be formed of at least one of a high-density-plasma (HDP) oxide, a spin-on-glass (SOG) layer, or a CVD oxide.

In another exemplary embodiment, the semiconductor layer may be formed to have a thickness greater than half the width of the opening 131. Thereafter, the semiconductor layer may be planarized until the top surface of the stacked structure ST is exposed. Thus, the semiconductor patterns 133 may be formed in, e.g., only in, the openings 131, respectively. For example, the semiconductor pattern 133 may fully fill the opening 131, thereby having a solid cylindrical shape. Accordingly, the gap-fill insulating pattern 135 may be excluded.

When the openings 131 are formed, e.g., to have a linear shape, a plurality of the semiconductor patterns 133 and a plurality of insulating patterns interposed therebetween may be formed in the openings 131. For instance, the formation of the semiconductor patterns 131 may include sequentially forming a semiconductor layer and a gap-fill insulating layer in the openings 131, and patterning the semiconductor layer and the gap-fill insulating layer to form the semiconductor patterns 133 having a rectangular shape from a top view in the opening 131. The semiconductor pattern 133 may have a substantially "U"-shape from a cross-sectional view.

After the semiconductor patterns 133 are formed, bit line contact pads 137 may be formed on the semiconductor patterns 133, respectively. In an exemplary embodiment, the bit line contact pad 137 may be formed on a top surface of the gap-fill insulating pattern 135 and a top surface of the semiconductor pattern 133. For example, the bit line contact pad 137 may be formed of, e.g., a doped poly-silicon. Alternatively, the bit line contact pad 137 may be formed by, e.g., doping an upper portion of the semiconductor pattern 133 with dopants. The bit line contact pads 137 may have a different conductivity type from the semiconductor pattern 133. The bit line contact pad 137 and the semiconductor pattern 133 may constitute a rectifying element such as a diode.

Figure 6D:
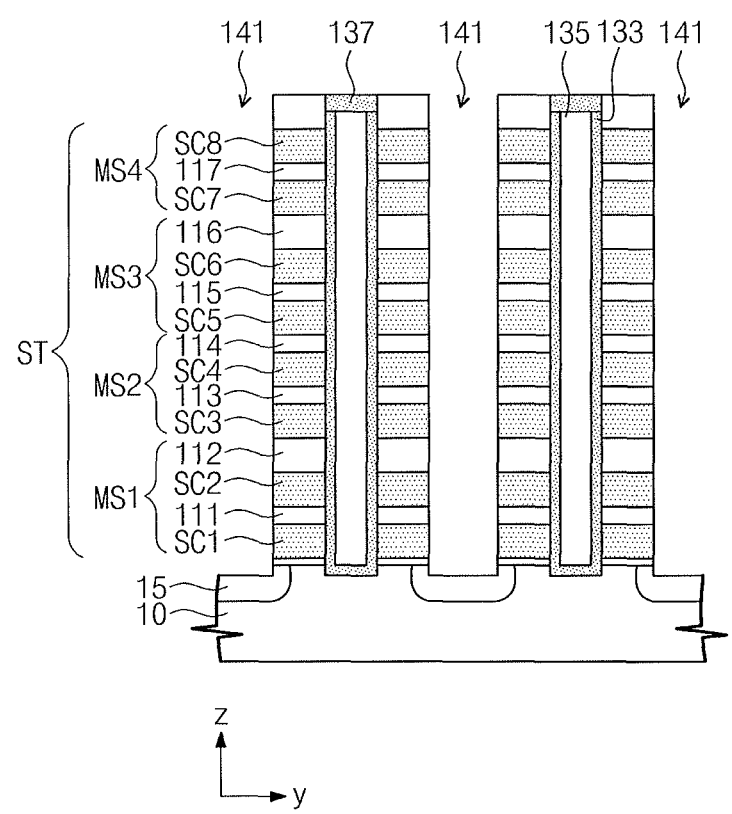
Figure 6E:
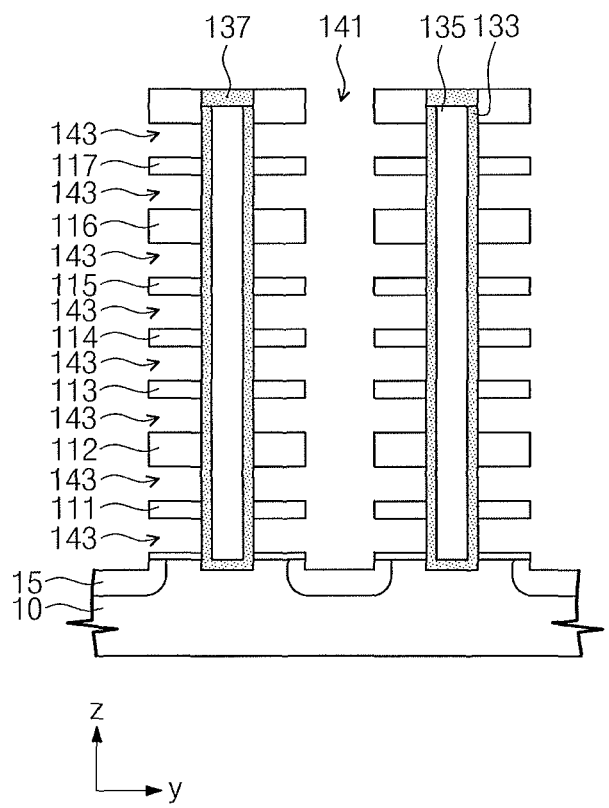
Figure 6F:
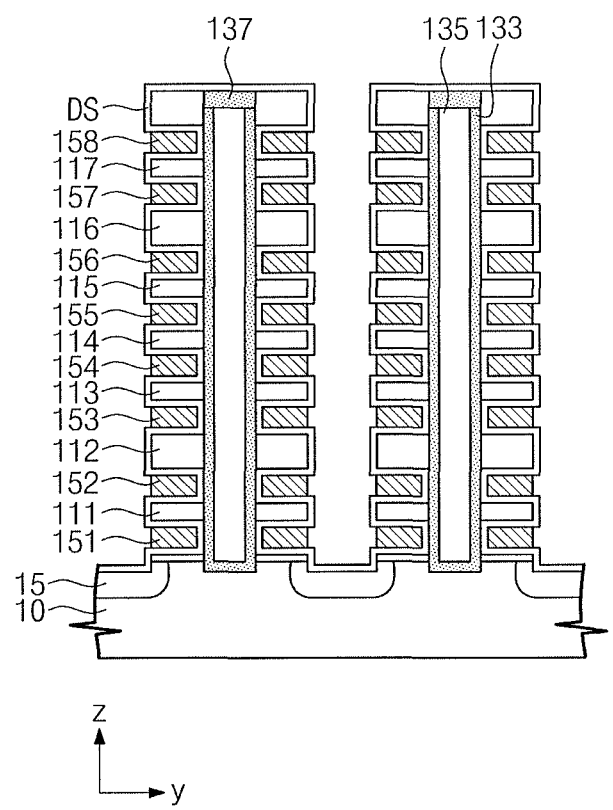

Referring to FIGS. 6D through 6F, the sacrificial layers SC1 to SC8 of the stacked structure ST may be removed. The sacrificial layers SC1 to SC8 may be replaced with a conductive material to form gate electrodes 151 to 158 stacked on the substrate 10. The formation of the gate electrodes 151 to 158 may include forming trenches 141 that partially or fully penetrate the stacked structure ST prior to replacing the sacrificial layers SC1 to SC8 of the stacked structure ST with a conductive material layer.

For example, as illustrated in FIG. 6D, each of the trenches 141 may be disposed between adjacent ones of the openings 131 including the semiconductor patterns 133 therein. As such, the stacked structure ST may be patterned to form the trenches 141 exposing the substrate 10 between the semiconductor patterns 133 adjacent to each other. The formation of the trenches 141 may include forming a mask pattern (not shown), which defines two-dimensional arrangement positions of the trenches 141, on the stacked structure ST and anisotropically etching the stacked structure ST using the mask pattern as an etch mask.

The trenches 141 may be spaced apart from the semiconductor patterns 133 to expose sidewalls of the sacrificial layers SC1 to SC8 and sidewalls of the insulating layers 111 to 117. In a plan view, the trenches 141 may be formed to have, e.g., a linear or rectangular shape. In terms of a vertical depth, the trenches 141 may be formed to expose at least a top surface of the lowermost one of the sacrificial layers SC1 to SC8. In some embodiments, due to, e.g., an over etch during the formation of the trenches 141, a top surface of the substrate 10 under the trenches 141 may be recessed by a specific depth. The trench 141 may be formed to have a tapered shape.

As shown in FIG. 4, due to the formation of the trenches 141, the stacked structure ST may have a linear shape extending parallel to the trenches 141. In an exemplary embodiment, a plurality of the semiconductor patterns 133 may be arranged parallel to the trenches 141 to penetrate the linear stacked structure ST. The linear stacked structure ST may have an inner sidewall adjacent to the semiconductor pattern 133 and an outer sidewall exposed by the trench 141. For example, the patterned sacrificial layers SC1 to SC8 and the patterned insulating layers 111 to 117 may be alternately and repeatedly stacked on the substrate 10.

In an exemplary embodiment, although the trench 141 is linear, end portions of the stacked structure ST may remain on the contact region CTR. For example, the stacked structure ST may have a comb shape or a finger shape.

An impurity region 15 may be locally formed in the substrate 10, e.g., under the trench 141. The impurity region 15 may serve as, e.g., the common source line described with reference to FIG. 3. The stacked structure ST, in which the trenches 141 are formed, may be used as an implantation mask during an ion implantation process for forming the impurity region 15.

Figure 5L:
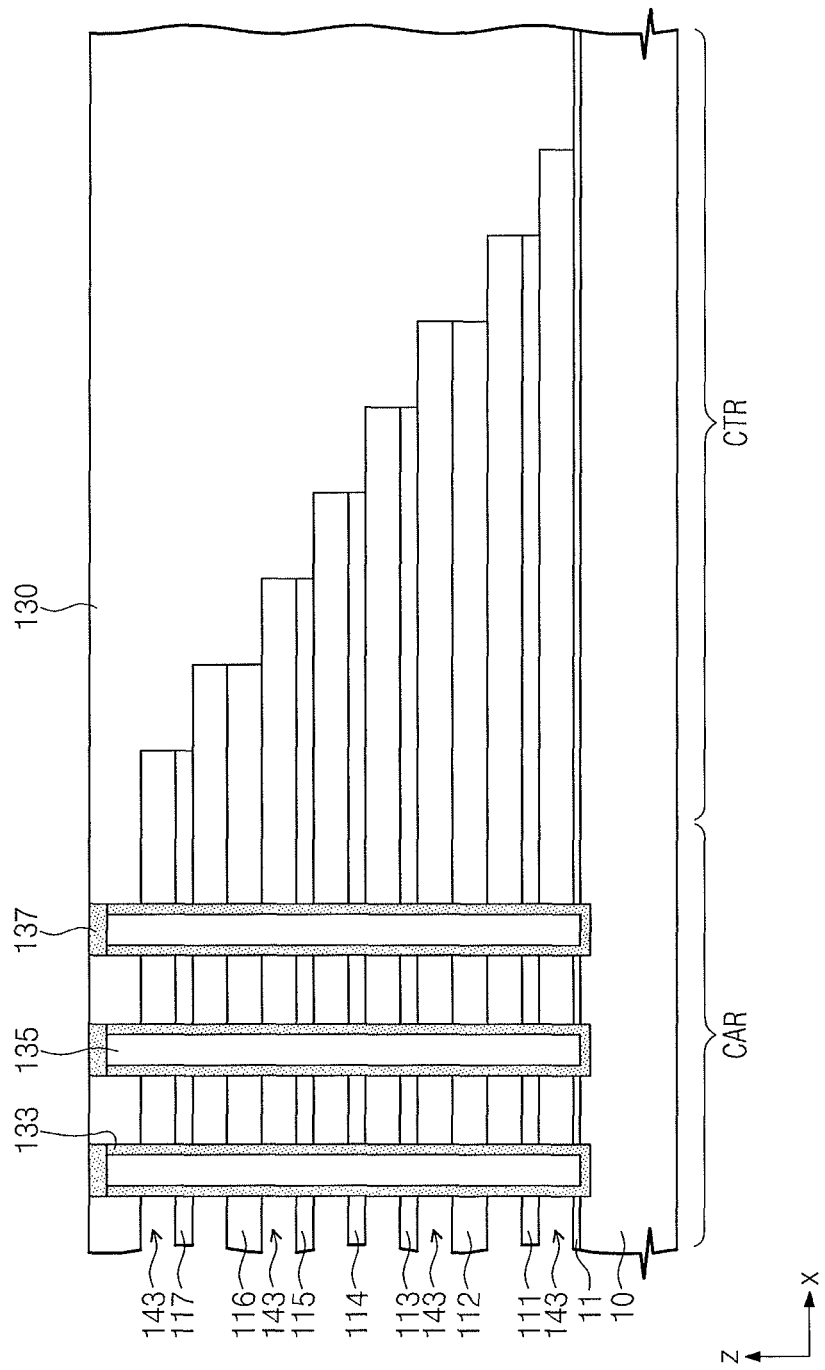

The replacing process may include removing the sacrificial layers SC1 to SC8 exposed by the trenches 141 to form undercut regions 143 between the patterned insulating layers 111 to 117 and between the patterned insulating layer 117 and the interlayer insulating layer 130, as shown in FIGS. 5L and 6E. Thereafter, a data storing layer DS and gate electrodes 151 to 158 may be formed to fill the undercut regions 143, as shown in FIGS. 5J and 6F.

Referring to FIGS. 5L and 6E, the undercut regions 143 may be formed by removing the patterned sacrificial layers SC1 to SC8 between the patterned insulating layers 111 to 117 and between the insulating layer 117 and the interlayer insulating layer 130. For example, the patterned sacrificial layers SC1 to SC8 may be isotropically etched using an etch recipe having an etching selectivity with respect to the patterned insulating layers 111 to 117 and the interlayer insulating layer 130. Thus, the undercut regions 143 may be formed. The patterned sacrificial layers SC1 to SC8 may be fully removed by using, e.g., an isotropic etching process. For example, when the patterned sacrificial layers SC1 to SC8 are formed of silicon nitride, and the patterned insulating layers 111 to 117 and the interlayer insulating layer 130 are formed of silicon oxide. Accordingly, the patterned sacrificial layers SC1 to SC8 may be removed using, e.g., an etchant with phosphoric acid.

The undercut regions 143 may be formed to partially expose portions of a sidewall of the semiconductor pattern 133. The lowermost one of the recess regions 143 may be defined by the lower gate insulating layer 11. Vertical thicknesses of the recess regions 143 may be determined by initial deposition thicknesses of the sacrificial layers SC1 to SC8, e.g., as described with reference to FIGS. 5A and 6A.

Figure 5M:
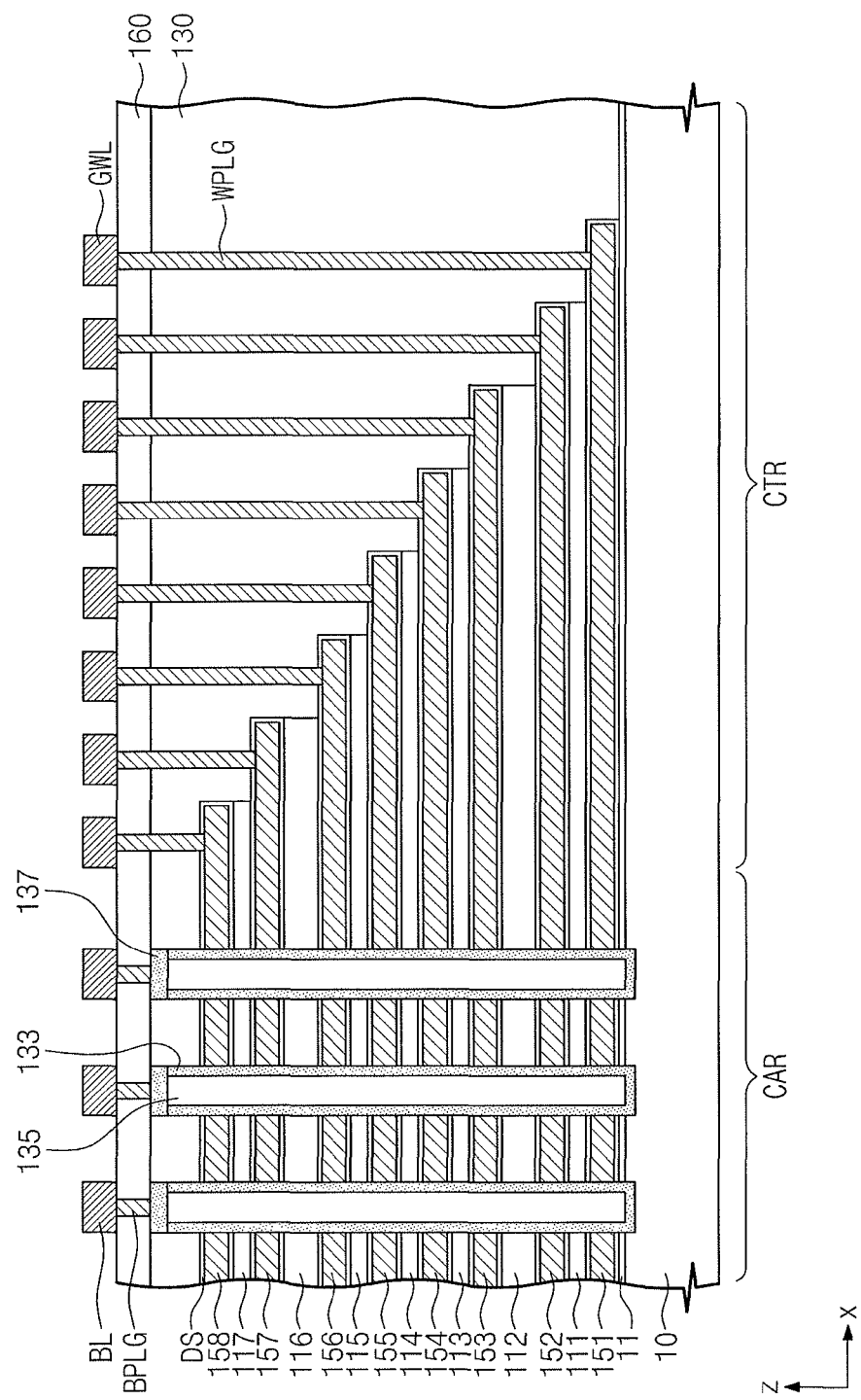

Referring to FIGS. 5M and 6F, the gate electrodes 151 to 158 may be formed in the undercut regions 143. The formation of the gate electrodes 151 to 158 may include forming a conductive layer in the undercut regions 143 and the trench 141, and then removing the conductive layer from the trench 141 to form the gate electrodes 151 to 158 as being vertically spaced apart from each other.

The conductive layer may be formed using a deposition technique (e.g., a CVD or ALD technique) capable of providing an excellent step coverage property. For example, the conductive layer may be formed to fill the undercut regions 143 and conformally cover inner walls of the trench 141. The conductive layer may be deposited to have a greater thickness than half a vertical thickness of the undercut region 143, according to an exemplary embodiment. For example, a horizontal width of the trench 141 may be greater than the vertical thickness of the undercut region 143, and the conductive layer may partially fill the trench 141 and an empty space having a top-open shape may be formed in a central portion of the trench 141. The conductive layer may include, e.g., at least one of doped poly-silicon, tungsten, metal nitrides, and metal silicides. In an exemplary embodiment, the formation of the conductive layer may include sequentially forming a barrier metal layer (e.g., a metal nitride layer) and a metal layer (e.g., a tungsten layer). However, embodiments are not limited to FLASH memory devices, and thus the material and structure of the conductive layer may be variously changed.

The removal of the conductive layer from the trench 141 may include anisotropically etching the conductive layer using an uppermost insulation layer or an additional hard mask pattern (not shown) formed on the uppermost insulating layer as an etching mask. Since the conductive layer may be removed from the trench 141, a portion of the data storing layer DS adjacent to the substrate 10 or the substrate 10 may be exposed therethrough. For example, as illustrated in FIGS. 6E and 6F, a top surface of the substrate 10 under the trench 141 may be recessed.

The gate electrodes 151 to 158 in the undercut regions 143 may constitute a gate structure. In some embodiments, as shown in FIG. 4, the gate structure GP may have a line shape parallel to the trench 141 and be penetrated by a plurality of the semiconductor patterns 133 arranged along the direction parallel to the trench 141. The gate electrodes 151 to 158 may include outer sidewalls adjacent to the trench 141 and inner sidewalls adjacent to the semiconductor pattern 133. The gate electrodes 151 to 158 may be formed to partially envelope or run across a sidewall of the semiconductor pattern 133. Alternatively, the gate electrodes 151 to 158, which are disposed in one block of memory cell array, may be connected with each other in the contact region CTR to form a comb or finger structure.

The gate electrodes 151 to 158 may be part of one of the string selection line SSL, the ground selection line GSL, and the word lines WL described with reference to FIG. 2. For example, the uppermost and lowermost gate electrodes 151 and 158 may serve as the string selection line SSL and the ground selection line GSL, respectively. The gate electrodes 152 to 157 between the uppermost and lowermost gate electrodes 151 and 158 may serve the word lines WL. Alternatively, as described with reference to FIG. 3, the uppermost gate 158 and a next uppermost gate 157 may serve as the string selection line SSL of FIG. 2, and the lowermost gate electrode 151 and a next lowermost gate electrode 152 may serve as the ground selection line GSL of FIG. 2.

After the gate structure is formed, a separation insulating layer 160 may be formed between the gate structures adjacent to each other. The separation insulating layer 160 may be formed of at least one of a silicon oxide layer, a silicon nitride layer, and a silicon oxynitride layer.

In an exemplary embodiment, the data storing layer DS may be formed in the undercut regions 143 before the gate electrodes 151 to 158 are formed. The data storing layer DS may store charges using, e.g., Fowler-Nordheim (FN) tunneling caused by a voltage difference between the semiconductor pattern 133 and the gate electrodes 151 to 158 (e.g., WL of FIG. 4). For example, the data storing layer DS may include at least one of a charge trap insulating layer, a floating gate electrode, and an insulating layer including conductive nano dots. Alternatively, the data storing layer DS may be formed of materials based on different data-writing principles. For example, the data storing layer DS may include one of materials having a variable resistance property or a phase changeable property.

The data storing layer DS may be conformally formed on a surface of a stacked structure having the undercut regions 143, e.g., as illustrated in FIG. 6F. The data storing layer DS may be formed using a deposition technique (e.g., a CVD or ALD technique) capable of providing an excellent step coverage property. The data storing layer DS may be formed to have a thickness smaller than half the thickness of the undercut regions 143. Accordingly, the data storing layer DS may be formed to partially cover the sidewalls of the semiconductor pattern 133 exposed by the undercut regions 143.

According to an exemplary embodiment, the data storing layer DS may be laterally extended to cover bottom and top surfaces of the patterned insulating layers 111 to 117 and the interlayer insulating layer 130 that define the undercut regions 143. The data storing layer DS may be formed in both the cell array region CAR and the contact region CTR. In addition, the data storing layer DS may be deposited to cover at least a portion of the top surface of the substrate 10 under the trenches 141, the top surface of the interlayer insulating layer 130, and sidewalls of the patterned insulating layers 111 to 117 and the interlayer insulating layer 130 adjacent to the trenches 141. Further, the data storing layer DS may cover a top surface of the lower gate insulating layer 11 exposed by the lowermost undercut region 143. The data storing layer DS may be a continuous layer.

Figure 7A:
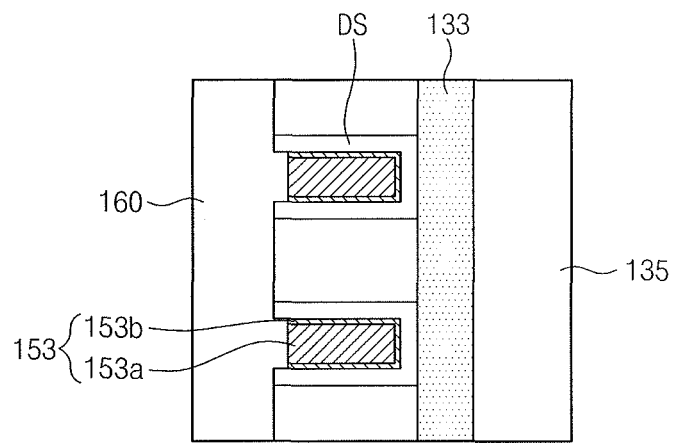
FIGS. 7A to 7D illustrate enlarged views of a portion 'A' of FIG. 6G, according to exemplary embodiments.

In another exemplary embodiment, the data storing layer DS may be confinedly disposed in, e.g., may be disposed only in, each of the undercut regions 143, e.g., as illustrated in FIG. 7A. That is, the data storing layers DS in the undercut regions 143 may be vertically spaced apart from each other. Accordingly, it may be possible to reduce the possibility of and/or prevent charges of the data storing layer DS in one undercut region 143 from diffusing or spreading into the data storing layers DS in other undercut regions 143.

Figure 7B:
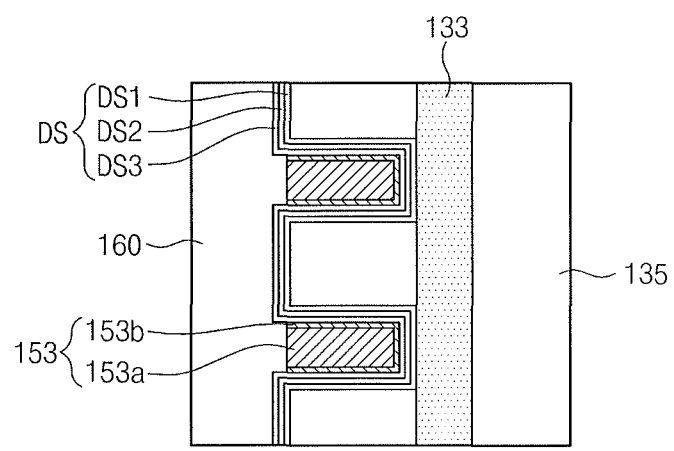
Figure 7C:
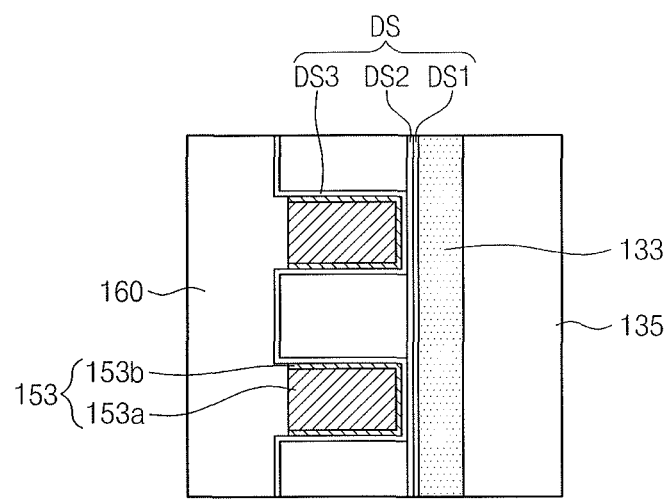
Figure 7D:
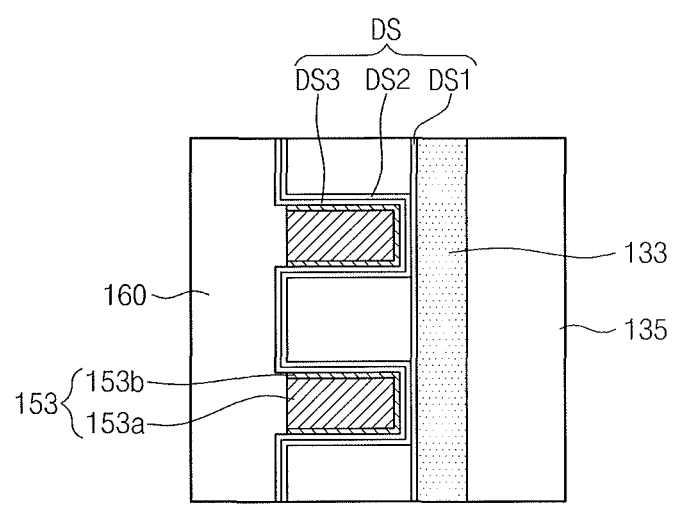

The data storing layer DS, e.g., the data storing layer DS illustrated in FIG. 6F and the data storing layer DS illustrated in FIG. 7A, may include a tunnel insulating layer DS1, a charge trap layer DS2, and a blocking insulating layer DS3, as illustrated in FIGS. 7B through 7D. At least one of the tunnel insulating layer DS1, the charge trap layer DS2, and the blocking insulating layer DS1 may be between the semiconductor pattern 133 and the gate electrodes 151 to 158.

According to an exemplary embodiment, the tunnel insulating layer DS1 may be directly in contact with the semiconductor pattern 133. The tunnel insulating layer DS1 may be formed of a material having, e.g., a lower dielectric constant than the blocking insulating layer DS. For example, the tunnel insulating layer DS may include at least one of an oxide, a nitride, or an oxynitride. The charge trap layer DS2 may be, e.g., an insulating layer having rich charge trap sites (e.g. a silicon nitride layer) or an insulating layer having conductive grains.

The blocking insulating layer DS3 may include at least one of silicon oxide, silicon nitride, silicon oxynitride, and/or a material having a high-k dielectric. The blocking insulating layer DS3 may be, e.g., a multilayered structure including a plurality of layers. The high-k dielectric refers to an insulating material having a higher dielectric constant than silicon oxide. For example, the high-k dielectric may include at least one of tantalum oxide, titanium oxide, hafnium oxide, zirconium oxide, aluminum oxide, yttrium oxide, niobium oxide, cesium oxide, indium oxide, iridium oxide, barium-strontium-titanate (BST) materials, and lead-zirconium-titanate (PZT) materials).

Even though not shown, the blocking insulating layer DS3 may include a first blocking insulating layer and a second blocking insulating layer. The first and second blocking insulating layers may be formed of materials different from each other. One of the first and second blocking insulating layers may include a material having a band-gap narrower than the tunnel insulating layer and wider than that of the charge trap layer. For example, the first blocking insulating layer may be formed of one of high-k dielectric materials such as aluminum oxide and hafnium oxide. The second blocking insulating layer may be formed of a material having a smaller dielectric constant than the first blocking insulating layer. Alternatively, the second blocking insulating layer may be formed of one of the high-k dielectric materials, and the first blocking insulating layer may be formed of a material having a smaller dielectric constant than the second blocking insulating layer.

The tunnel insulating layer DS1 may be a silicon oxide layer, the charge trap layer DS2 may be a silicon nitride layer, and the blocking insulating layer DS3 may include an aluminum oxide layer.

According to another exemplary embodiment, as illustrated in FIG. 7C, the tunnel insulating layer DS1 and the charge trap layer DS2 may vertically extend to run across inner sidewalls of the gate electrodes 151 to 158 and to cover an outer sidewall of the semiconductor pattern 133. The tunnel insulating layer DS1 and the charge trap layer DS2 in FIG. 7C may be formed on the inner wall of the opening before the formation of the semiconductor pattern 133 described with reference to FIGS. 5K and 6C. The blocking insulating layer DS3 may be conformally formed on inner surfaces of the undercut regions 143 after the undercut regions 143 are formed. Accordingly, the blocking insulating layer DS3 may be directly in contact with top and bottom surfaces of the insulating layers 111 to 117.

According to yet another exemplary embodiment, as shown in FIG. 7D, the tunnel insulating layer DS1 may be formed to cover the inner wall of the opening 131 before the semiconductor pattern 133 is formed, and the charge trap layer DS2 and the blocking insulating layer DS3 may be conformally and sequentially formed on the inner surfaces of the undercut regions 143.

Figure 6G:
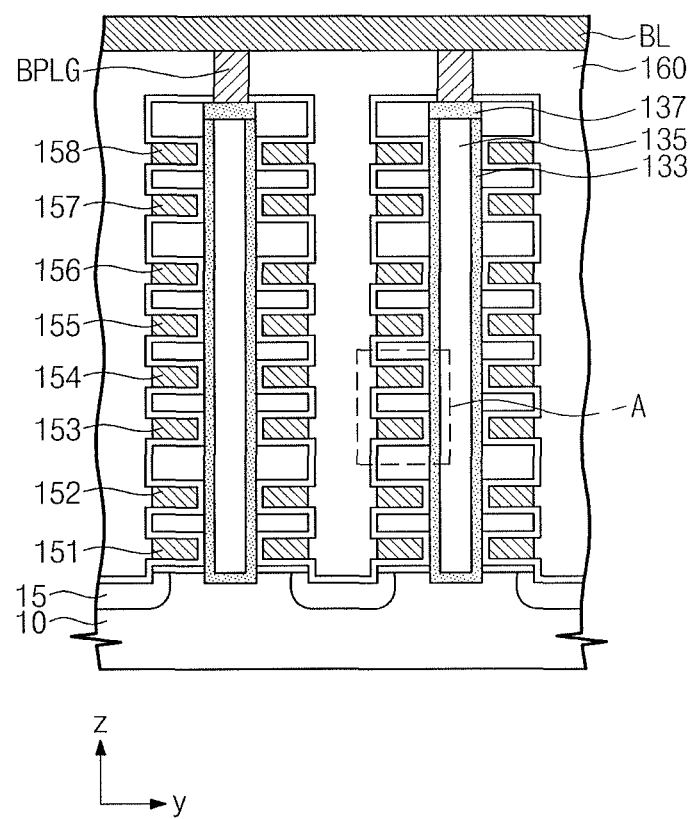

Referring to FIGS. 5M and 6G, an interconnection structure may be formed to connect the gate electrodes 151 to 158, e.g., of the cell array region CAR, to the peripheral circuits.

According to an exemplary embodiment, bit line contact plugs BPLG may be formed in the cell array region CAR, and word line contact plugs WPLG may be formed in the contact region CTR. The bit line contact plugs BPLG may be connected to the bit line contact pads 137, respectively. The word line contact plugs WPLG may be connected to the exposed end portions of the gate electrodes 151 to 158, respectively. The end portions of the gate electrodes 151 to 158 may be disposed at different levels from each other. The word line contact plugs WPLG may be respectively connected to gate electrodes that are horizontally spaced apart from each other, e.g., as illustrated in FIG. 4. For example, the gate electrodes disposed at the same level may be connected to one of global word lines GWL.

The formation of the contact plugs BPLG and WPLG may include forming contact holes penetrating the insulating layer 130 and 160, and filling the contact holes with a conductive material.

The contact plugs BPLG and WPLG may include a metallic material (e.g. tungsten). The formation of the contact plugs BPLG and WPLG may include sequentially forming a barrier metal layer (e.g. a metal nitride layer) and a metal layer (e.g. a tungsten layer).

After the contact plugs BPLG and WPLG are formed, bit lines BL may be formed on the bit line contact plugs BPLG to cross over the gate electrodes 151 to 158. The global word lines GWL may be formed on the word line contact plugs WPLG.

Figure 8:
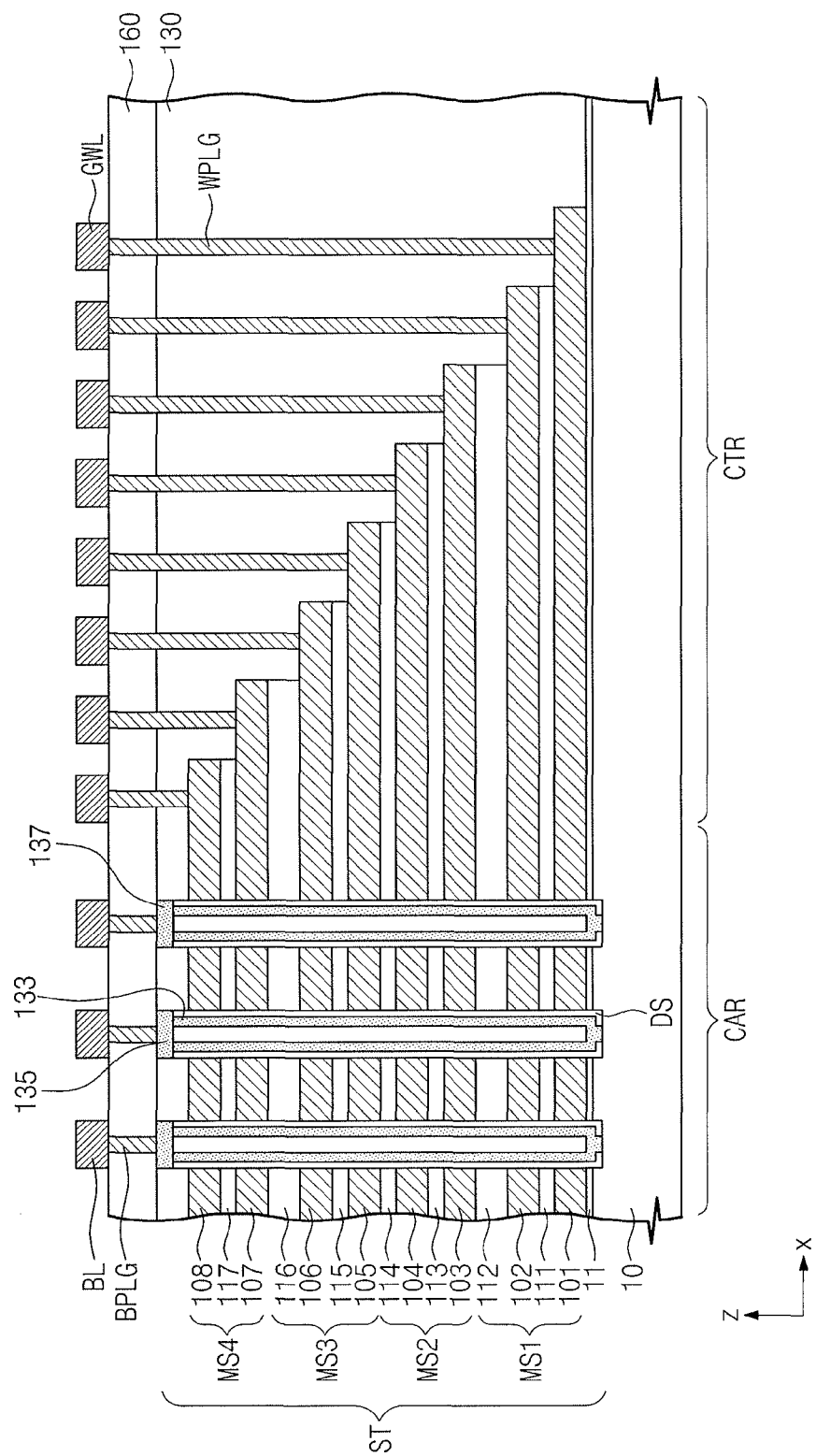
FIG. 8 illustrates a cross-sectional view of a three-dimensional semiconductor device, according to an exemplary embodiment.

FIG. 8 illustrates a cross-sectional view of a three-dimensional semiconductor device, according to an exemplary embodiment.

In the present embodiment, the same elements as described in the above embodiment will be indicated by the same reference numerals or the same reference designators. For the purpose of ease and convenience in explanation, the descriptions to the same elements as in the above embodiment will be omitted or mentioned briefly. That is, differences between the following exemplary embodiment and the above exemplary embodiment will be mainly described hereinafter.

For fabrication of the three-dimensional semiconductor device illustrated in FIG. 8, a stacked structure ST including a plurality of multi-layered structures MS1 to MS4 may be formed on a substrate 10. Gate conductive layers 101 to 108 and insulating layer 111 to 118 may be alternately and repeatedly stacked to form the stacked structure ST.

The gate conductive layers 101 to 108 may be formed of, e.g., an amorphous silicon or poly-silicon doped with n-type or p-type impurities (e.g. boron or phosphorous). A lower gate insulating layer 11 having a very thin thickness may be formed between the lowermost gate conductive layer 101 and the substrate 10. The lower gate insulating layer 11 may be formed of, e.g., an oxide (e.g. a thermal oxide).

The gate conductive layers 101 to 108 may serve as the word lines WL0 to WL3 and selection lines GSL and SSL. In some embodiments, the gate conductive layers 101 to 108 may be formed using, e.g., a deposition technique. Vertical thicknesses, e.g., in the z-axis direction, of the gate conductive layers 101 to 108 may define channel lengths of vertical transistors that use respective ones the gate conductive layers 101 to 108 as their gate electrodes.

Each of the vertical transistors, according to an exemplary embodiment, may have a more precisely controlled channel length, compared with using a patterning method to define the channel length. Spaces between vertically adjacent ones of the gate conductive layers 101 to 108 or thicknesses of the insulating layers 111 to 118 may be controlled in such a way that two adjacent inversion regions may overlap with each other in the semiconductor pattern 133 formed thereafter. In an exemplary embodiment, the gate conductive layers 101 to 108 may be formed to have substantially the same thickness. In another exemplary embodiment, the uppermost and lowermost gate conductive layers 101 and 108 may be thicker than other gate conductive layers 102 to 107 interposed therebetween. Some of the insulating layers (e.g., 112 and 117) may be thicker than other insulating layers (e.g., 111, 113 to 116, and 118). The layer number, thicknesses, and materials of layers constituting the stacked layer structure ST may be variously modified in consideration of, e.g., electric characteristics of the memory cell transistor and/or technical difficulties in subsequent patterning processes.

Before the stacked structure ST is formed on the substrate 10, impurity region (not shown) used as a common source line (CSL of FIG. 2) may be formed in the substrate 10. Semiconductor patterns 133 may be formed to penetrate the stacked structure ST including the gate conductive layers 101 to 108. The semiconductor patterns 133 may be connected to the substrate 10.

A data storing layer DS may be formed before the semiconductor patterns 133 are formed, according to an exemplary embodiment. For example, after the data storing layer DS is formed, a portion of the data storing layer DS adjacent to the substrate 10 may be removed. The semiconductor patterns 133 may penetrate the data storing layer DS to be connected to the substrate 10, e.g., the data storing layer DS may surround an outer sidewall of each of the semiconductor patterns 133.

The stacked structure ST including the gate conductive layers 101 to 108 may be patterned by, e.g., the similar manners as described with reference to FIGS. 5B through 5I. For example, the gate conductive layers 101 to 108 may be arranged in the stacked structure ST in place of the sacrificial layers SC1 to SC8, e.g., as illustrated in FIG. 5A. Then, the gate conductive layers 101 to 108 may be processed to have a stepwise shape according to FIGS. 5B to 5E so that conductive layers having the stepwise shape are formed in the contact region CTR. The gate conductive layers 101 to 108 may be patterned in the cell array region CAR to foam the gate electrodes. According to an exemplary embodiment, forming the undercut regions 143, e.g., as described in FIG. 5L, may be omitted.

The stacked structure ST including the gate conductive layers 101 to 108 may have a stepwise shape in the contact region CTR so that end portions of the gate conductive layers 101 to 108 are exposed at different locations from each other, e.g., along the x-axis direction. The exposed end portions of the gate conductive layers 101 to 108 may be connected to respective ones of the word line plugs WPLG.

Figure 9:
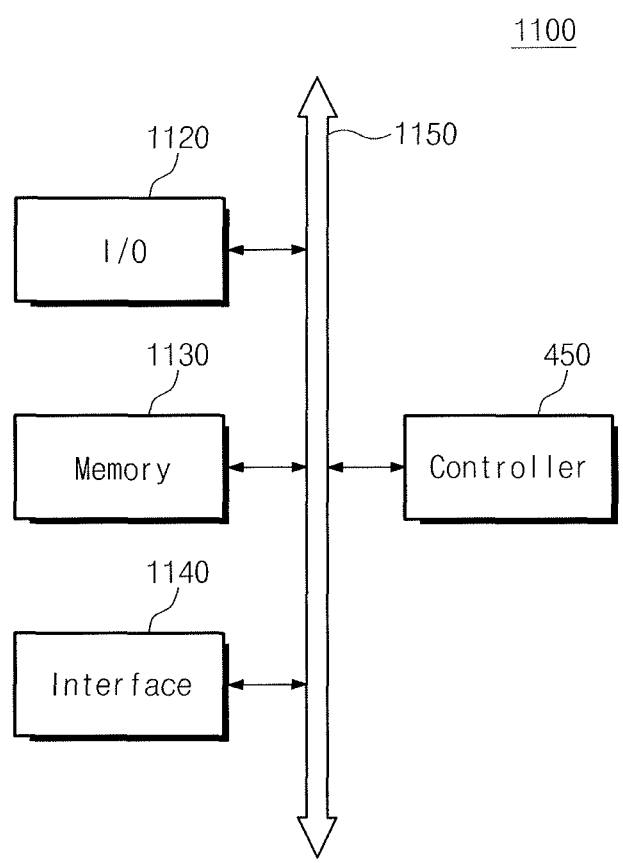
FIG. 9 illustrates a schematic block diagram of an example of a memory system including a three-dimensional semiconductor device, according to an exemplary embodiment.

FIG. 9 illustrates a schematic block diagram of an example of a memory system including three-dimensional semiconductor devices, according to an exemplary embodiment.

Referring to FIG. 9, a memory system 1100 may be applied to, e.g., a PDA (personal digital assistant), a portable computer, a web tablet, a wireless phone, a mobile phone, a digital music player, a memory card, and/or all the devices that can transmit and/or receive data in a wireless communication environment.

The memory system 1100 may include a controller 450, an input/output device 1120 such as a keypad and a display device, a memory 1130, an interface 1140, and a bus 1150. The memory 1130 and the interface 1140 may communicate with each other through the bus 1150.

The controller 1110 may include at least one microprocessor, at least one digital signal processor, at least one micro controller, or other process devices similar to the microprocessor, the digital signal processor, or the micro controller. The memory 1130 may be used to store, e.g., an instruction executed by the controller 1110. The input/output device 1120 may receive data or a signal from the outside of the system 1100 or transmit data or a signal to the outside of the system 1100. For example, the input/output device 1120 may include a keyboard, a keypad, and/or a displayer.

The memory 1130 may include a plurality of three-dimensional semiconductor, device according to exemplary embodiments. The memory 1130 may further include a different kind of memory, e.g., a volatile memory device capable of random access and various kinds of memories. The interface 1140 may transmit data to a communication network and/or receive data from a communication network.

Figure 10:
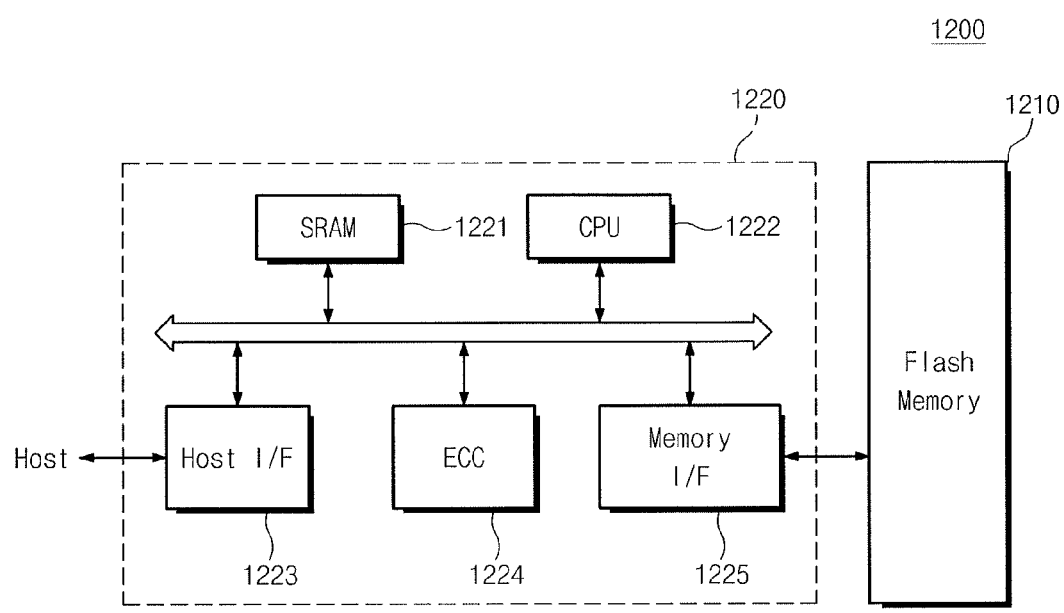
FIG. 10 illustrates a schematic block diagram of an example of a memory card including a three-dimensional semiconductor device, according to an exemplary embodiment.

FIG. 10 illustrates a schematic block diagram of a memory card 1200 including three-dimensional semiconductor devices, according to an exemplary embodiment.

Referring to FIG. 10, the memory card 1200 for supporting a large capacity storage capability may be fitted with a flash memory device 1210. The flash memory device 1210 may include the three-dimensional semiconductor device, according to an exemplary embodiment. The memory card 1200 may include, e.g., a memory controller 1220 controlling every data exchange between a host and the flash memory device 1210.

A static random access memory (SRAM) 1221 may be used as an operation memory of a central processing unit 1222. A host interface 1223 may include data exchange protocols of a host that is to be connected to the memory card 1200. An error correction block 1224 may detect and correct errors included in data readout from, e.g., a multi bit flash memory device 1210. A memory interface 1225 may interface with the flash memory device 1210 of an exemplary embodiment. The central processing unit 1222 may perform, e.g., every control operation for exchanging data of the memory controller 1220. Even though not depicted in drawings, it may be apparent to one of ordinary skill in the art that the memory card 1200, according to an exemplary embodiment, may further include a ROM (not shown) storing code data for interfacing with the host.

Figure 11:
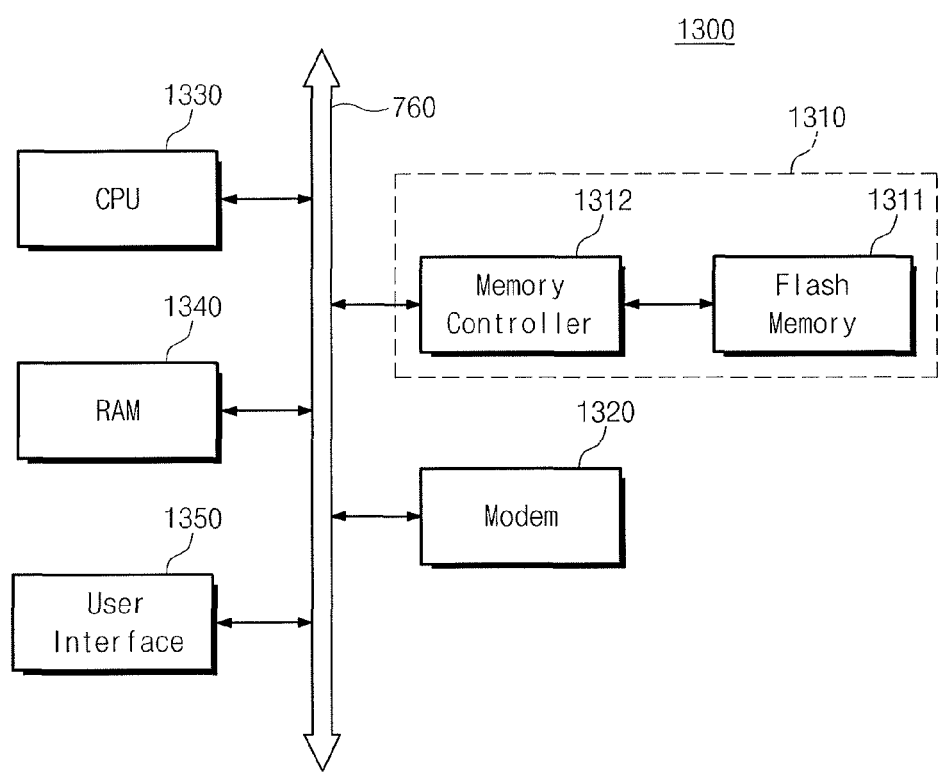
FIG. 11 illustrates a schematic block diagram of an example of an information processing system including a three-dimensional semiconductor device, according to an exemplary embodiment.

FIG. 11 illustrates a schematic block diagram of an information processing system including three-dimensional semiconductor devices, according to an exemplary embodiment.

Referring to FIG. 11, a flash memory system 1310 may be built in a data processing system 1300 such as a mobile product or a desktop computer. The flash memory system 1310 may include the three-dimensional semiconductor device, according to an exemplary embodiment. The data processing system 1300, according to an exemplary embodiment, may include the flash memory system 1310, a modem 1320, a central processing unit 1330, a RAM, and a user interface 1350 that are electrically connected to a system bus 760. The flash memory system 1310 may be constructed so as to be similar to or substantially identical to the memory system or the flash memory system described above.

The flash memory system 1310 may store data processed by the central processing unit 1330 or data inputted from an external device. The flash memory system 1310 may include, e.g., a solid state disk (SSD). For example, the data processing system 1310 may stably store large amounts of data in the flash memory system 1310. As reliability is improved, the flash memory system 1310 may reduce resources used to correct errors, and may provide a high speed data exchange function to the data processing system 1300. Even though not depicted in the drawings, it may be apparent to one of ordinary skill in the art that the data processing unit 1300, according to an exemplary embodiment, may include an application chipset, a camera image processor (CIS), and/or an input/output device.

Three-dimensional semiconductor devices or memory systems, according to exemplary embodiments, may be mounted with various types of packages. For example, the three dimensional semiconductor devices or memory systems may be packaged in various types of packages, such as at least one of a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline (TSOP), a system in package (SIP), a multichip package (MCP), a wafer-level fabricated package (WFP), and a wafer-level processed stack package (WSP).

By way of summation of review, three-dimensional semiconductor memory devices having three-dimensionally arranged memory cells have been proposed. However, in order to mass produce three-dimensional semiconductor memory devices, new process technologies are being developed so as to provide a lower manufacturing cost per bit than two-dimensional memory devices, while maintaining or exceeding a level of reliability.

Embodiments, e.g., the exemplary embodiments discussed above, relate to methods of fabricating a three-dimensional semiconductor device including a gate structure having stacked gate electrodes formed to have a stepwise shape in the contact region. A number of photolithography processes for patterning a plurality of stacked layers may be reduced, and a number of trimming processes for reducing a mask pattern used in the photolithography process may also be reduced. Further, widths of exposed end portions of the gate electrodes in the contact region may be substantially uniform, and process variation caused by differences of processes applied to the stacked gate electrodes may be enhanced. Also, embodiments may provide methods of fabricating a three-dimensional semiconductor device with enhanced electrical characteristic.

Example embodiments have been disclosed herein, and although specific terms are employed, they are used and are to be interpreted in a generic and descriptive sense only and not for purpose of limitation. Therefore, it should be understood that the above embodiments are not limiting, but illustrative. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a three-dimensional semiconductor device, the method comprising:
   forming a stacked structure, the stacked structure including a first layer, a second layer, a third layer, and a fourth layer sequentially stacked on a substrate;
   forming a sacrificial spacer on a sidewall of the stacked structure such that the sacrificial spacer exposes a sidewall of the third layer; and
   recessing the exposed sidewall of the third layer thereby forming a recess region between the second and fourth layers.

2. A method of fabricating a three-dimensional semiconductor device, the method comprising:
   forming a stacked structure, the stacked structure including a first layer, a second layer, a third layer, and a fourth layer sequentially stacked on a substrate;
   forming a sacrificial spacer on a sidewall of the stacked structure, such that the sacrificial spacer exposes a sidewall of the third layer; and
   recessing the exposed sidewall of the third layer, thereby forming a recess region between the second and fourth layers, wherein:
   the first layer is formed of substantially a same first material as the third layer,
   the second layer is formed of substantially a same second material as the fourth layer, and
   the first material of the first and third layers have an etching selectivity with respect to the second material of the second and fourth layers.

3. The method as claimed in claim 2, wherein forming the sacrificial spacer includes:
   forming a sacrificial spacer layer to conformally cover the stacked structure, the sacrificial spacer layer being formed of a material having an etching selectivity with respect to the third layer during the recessing of the exposed sidewall of the third layer, and anisotropically etching the sacrificial spacer layer to form the sacrificial spacer.

4. The method as claimed in claim 2, wherein a sidewall of the first layer is covered by the sacrificial spacer during the forming of the recess region.

5. The method as claimed in claim 2, further comprising, after forming the recess region, etching the second and fourth layers to expose end portions of the first and third layers at locations different from each other.

6. The method as claimed in claim 2, wherein forming the stacked structure includes:

stacking a plurality of multi-layered structures on the substrate, each of the multi-layered structures including the first, the second, the third and the fourth layers sequentially stacked therein, and patterning the multi-layered structures to expose end portions of the multi-layered structures at locations different from each other to form patterned multi-layered structures.

7. The method as claimed in claim 6, wherein widths of the patterned multi-layered structures decrease as a distance between the substrate and the patterned multi-layered structures increases.

8. The method as claimed in claim 6, wherein patterning the multi-layered structures includes performing a plurality of etching processes that have different etching regions from each other and have different etching depths from each other.

9. The method as claimed in claim 6, wherein forming the sacrificial spacer includes:

forming a sacrificial spacer layer to conformally cover the stacked structure including the plurality of multi-layered structures, and anisotropically etching the sacrificial spacer layer such that the forming of the sacrificial spacer produces a plurality of sacrificial spacers, each of the sacrificial spacers being on a sidewall of one of the multi-layered structures such that the sidewall of the third layer in the one of the multi-layered structures is simultaneously exposed.

10. The method as claimed in claim 9, wherein the sacrificial spacer layer is formed of a material having an etching selectivity with respect to the third layers.

11. The method as claimed in claim 6, wherein forming the recess region includes forming a plurality of recess regions by simultaneously recessing sidewalls of the third layers of the multi-layered structures.

12. The method as claimed in claim 11, further comprising, after forming the plurality of recess regions, etching the second layers and the fourth layers of the multi-layered structures to expose end portions of the first layers and the third layers of the multi-layered structures at locations different from each other.

13. The method as claimed in claim 6, further comprising forming semiconductor patterns that penetrate the stacked structure in a cell array region, the substrate including the cell array region in which memory cells are to be formed and a contact region adjacent to the cell array region, and the semiconductor patterns being formed to be connected to the substrate.

14. The method as claimed in claim 13, further comprising:

patterning the stacked structure to form a trench between the semiconductor patterns, the trench exposing the substrate;

removing the first layers and the third layers exposed by the trench to form undercut regions between the second layers and the fourth layers; and confinedly forming conductive patterns in the undercut regions, respectively.

15. The method as claimed in claim 14, further comprising forming a data storing layer between the semiconductor patterns and the conductive patterns.

16. A method of fabricating a three-dimensional semiconductor device, the method comprising:

forming a stacked structure including a plurality of alternating first and second layers;

patterning the stacked structure to form at least one first step, the first step including multiple first and second layers having substantially a same width;

forming a sacrificial spacer on a sidewall of the first step, the sacrificial spacer exposing a sidewall of an upper layer of the multiple first layers in the first step; and recessing the exposed sidewall of only the exposed upper layer in the first step to form a recess region between two second layers in the first step.

17. The method as claimed in claim 16, wherein the second layers have an etching selectivity with respect to the first layers.

18. The method as claimed in claim 17, wherein the recess region is formed by recessing the exposed sidewall of the upper layer directly above the sacrificial spacer, the recess region being a void between adjacent ones of the second layers, and the method further comprising removing portions of the adjacent ones of the second layers to define the recess region.

19. The method as claimed in claim 18, wherein removing portions of the adjacent ones of the second layers defining the recess region includes simultaneously removing the sacrificial spacer.

20. The method as claimed in claim 16, further comprising:

replacing the first layers with conductive patterns; and forming contact plugs in contact with the conductive patterns.

* * * * *